(12) United States Patent
Wang et al.

(10) Patent No.: US 12,185,584 B2
(45) Date of Patent: Dec. 31, 2024

(54) DISPLAY SUBSTRATE AND DISPLAY APPARATUS

(71) Applicants: Chengdu BOE Optoelectronics Technology Co., Ltd., Sichuan (CN); BOE Technology Group Co., Ltd., Beijing (CN)

(72) Inventors: Rong Wang, Beijing (CN); Xiaoqing Shu, Beijing (CN); Mengmeng Du, Beijing (CN); Bo Zhang, Beijing (CN); Xiangdan Dong, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 17/780,531

(22) PCT Filed: Jul. 8, 2021

(86) PCT No.: PCT/CN2021/105280
§ 371 (c)(1),
(2) Date: May 27, 2022

(87) PCT Pub. No.: WO2023/279333
PCT Pub. Date: Jan. 12, 2023

(65) Prior Publication Data
US 2024/0172476 A1 May 23, 2024

(51) Int. Cl.
*H10K 59/121* (2023.01)
*G09G 3/3233* (2016.01)
*H10K 59/131* (2023.01)

(52) U.S. Cl.
CPC ....... *H10K 59/1213* (2023.02); *G09G 3/3233* (2013.01); *H10K 59/131* (2023.02);
(Continued)

(58) Field of Classification Search
CPC .......... H10K 59/12133; H10K 59/131; G09G 3/3233; G09G 2300/0426;
(Continued)

(56) References Cited

U.S. PATENT DOCUMENTS

2003/0043328 A1 3/2003 Hayashi
2010/0259699 A1 10/2010 Yen et al.
(Continued)

FOREIGN PATENT DOCUMENTS

CN 108681167 A 10/2018
CN 109300920 A 2/2019
(Continued)

*Primary Examiner* — Mark Edwards
(74) *Attorney, Agent, or Firm* — Ling Wu; Stephen Yang; Ling and Yang Intellectual Property

(57) ABSTRACT

Disclosed is a display substrate including first, second, third, and fourth sub-pixels; at least one sub-pixel includes a pixel drive circuit and a light emitting device, the pixel drive circuit includes a drive transistor; there is a first overlapping region between an orthographic projection of an anode of a light emitting device in the third sub-pixel on a base substrate and an orthographic projection of a gate electrode of a drive transistor in the third sub-pixel on the base substrate; there is no overlapping region or there is a second overlapping region between an orthographic projection of an anode of a light emitting device in the fourth sub-pixel on the base substrate and an orthographic projection of a gate electrode of a drive transistor in the fourth sub-pixel on the base substrate, an area of the second overlapping region is smaller than an area of the first overlapping region.

18 Claims, 20 Drawing Sheets

(52) U.S. Cl.
CPC .......... *G09G 2300/0426* (2013.01); *G09G 2300/0452* (2013.01); *G09G 2300/0819* (2013.01); *G09G 2300/0842* (2013.01); *G09G 2300/0861* (2013.01); *G09G 2310/0286* (2013.01); *G09G 2310/08* (2013.01); *G09G 2320/02* (2013.01); *G09G 2330/021* (2013.01)

(58) Field of Classification Search
CPC ... G09G 2300/0452; G09G 2300/0819; G09G 2300/0842; G09G 2300/0861; G09G 2310/0286; G09G 2310/08; G09G 2320/02; G09G 2330/021
USPC ........................................................ 345/214
See application file for complete search history.

(56) References Cited

U.S. PATENT DOCUMENTS

| | | | |
|---|---|---|---|
| 2016/0163247 A1 | 6/2016 | Lee et al. | |
| 2017/0194390 A1 | 7/2017 | Kim | |
| 2018/0212014 A1* | 7/2018 | Choi | H10K 59/1216 |
| 2019/0122599 A1 | 4/2019 | Wu et al. | |
| 2021/0026177 A1 | 1/2021 | He | |
| 2021/0151471 A1 | 5/2021 | Du et al. | |
| 2021/0193766 A1* | 6/2021 | Liu | H10K 59/353 |
| 2022/0336542 A1 | 10/2022 | Chen et al. | |

FOREIGN PATENT DOCUMENTS

| | | | | |
|---|---|---|---|---|
| CN | 109524445 A | | 3/2019 | |
| CN | 110718180 A | | 1/2020 | |
| CN | 111463255 A | | 7/2020 | |
| CN | 111490068 A | * | 8/2020 | ........... H01L 27/124 |
| JP | 2003-75869 A | | 3/2003 | |

\* cited by examiner

DISPLAY SUBSTRATE AND DISPLAY APPARATUS

CROSS-REFERENCE TO RELATED APPLICATION

The present application is a U.S. National Phase Entry of International Application No. PCT/CN2021/105280 having an international filing date of Jul. 8, 2021. The entire contents of the above-identified application are hereby incorporated by reference.

TECHNICAL FIELD

Embodiments of the present disclosure relate to, but are not limited to, the field of display technologies, and particularly to a display substrate and a display apparatus.

BACKGROUND

An Organic Light Emitting Diode (OLED) is an active light emitting display device, which has advantages of auto-luminescence, a wide viewing angle, a high contrast ratio, low power consumption, an extremely high response speed, lightness and thinness, bendability, and a low cost, etc. With continuous development of display technologies, a display apparatus using an OLED as a light emitting device and using a Thin Film Transistor (TFT) for signal control becomes a mainstream product in the field of display at present.

SUMMARY

The following is a summary of subject matters described herein in detail. This summary is not intended to limit the scope of protection of claims.

An embodiment of the present disclosure provides a display substrate, including: multiple sub-pixels arranged in an array, wherein the multiple sub-pixels include a first sub-pixel emitting light of a first color, a second sub-pixel emitting light of a second color, and a third sub-pixel and a fourth sub-pixel emitting light of a third color; at least one sub-pixel includes a drive circuit layer disposed on a base substrate and a light emitting structure layer disposed on one side of the drive circuit layer away from the base substrate, the drive circuit layer includes a pixel drive circuit, the pixel drive circuit includes a drive transistor and a storage capacitor, and the light emitting structure layer includes a light emitting device connected with the pixel drive circuit; there is a first overlapping region between an orthographic projection of an anode of a light emitting device in the third sub-pixel on the base substrate and an orthographic projection of a gate electrode of a drive transistor in the third sub-pixel on the base substrate; there is no overlapping region between an orthographic projection of an anode of a light emitting device in the fourth sub-pixel on the base substrate and an orthographic projection of a gate electrode of a drive transistor in the fourth sub-pixel on the base substrate; or, there is a second overlapping region between an orthographic projection of an anode of a light emitting device in the fourth sub-pixel on the base substrate and an orthographic projection of a gate electrode of a drive transistor in the fourth sub-pixel on the base substrate, wherein an area of the second overlapping region is smaller than an area of the first overlapping region; the fourth sub-pixel, or the first sub-pixel or the second sub-pixel adjacent to the fourth sub-pixel, includes a conductive block, wherein there is a third overlapping region between an orthographic projection of the conductive block on the base substrate and the orthographic projection of the gate electrode of the drive transistor in the fourth sub-pixel on the base substrate.

An embodiment of the present disclosure further provides a display apparatus including the display substrate described above.

After accompanying drawings and detailed description are read and understood, other aspects may be understood.

BRIEF DESCRIPTION OF DRAWINGS

FIG. 7b is a schematic plan view of the first conductive layer in FIG. 7a.

FIG. 8b is a schematic plan view of the second conductive layer in FIG. 8a.

FIG. 9b is a schematic plan view of multiple vias of the fourth insulation layer in FIG. 9a.

FIG. 10b is a schematic plan view of the third conductive layer in FIG. 10a.

FIG. 11b is a schematic plan view of multiple vias of the first planarization layer in FIG. 11a.

FIG. 12b is a schematic plan view of the fourth conductive layer in FIG. 12a.

FIG. 13b is a schematic plan view of multiple vias of the second planarization layer in FIG. 13a.

FIG. 14b is a schematic plan view of the anode in FIG. 14a.

FIG. 15b is a schematic plan view of the pixel definition layer in FIG. 15a.

Figure 1:
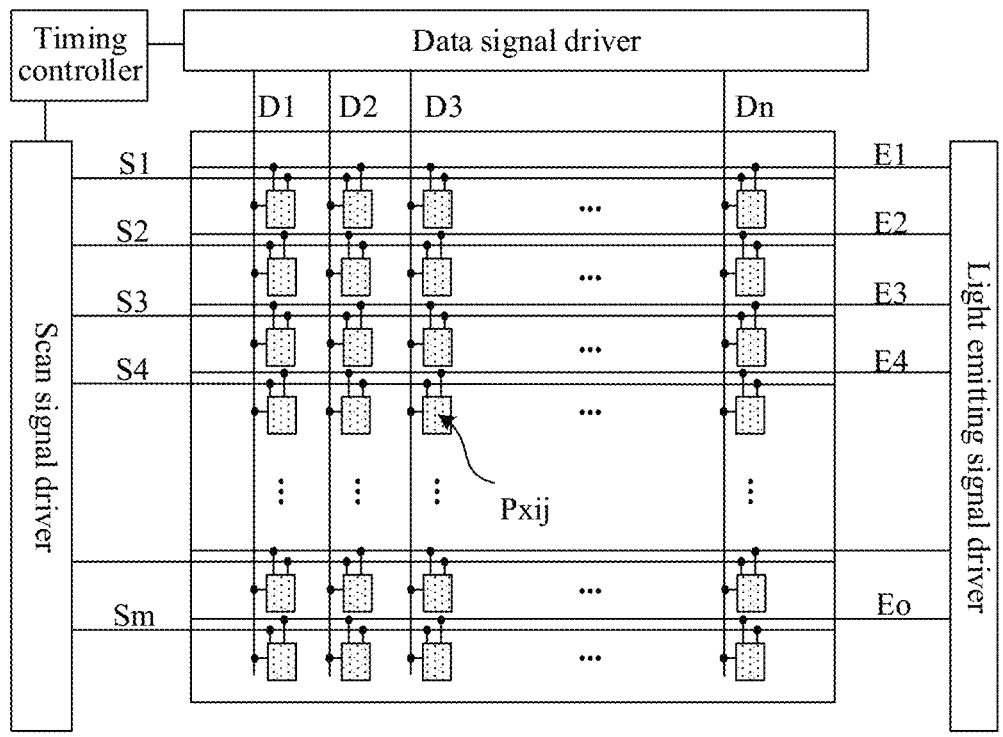
FIG. 1 is a schematic diagram of a structure of a display apparatus according to some exemplary embodiments.

| Reference signs are as follows. | | |
|---|---|---|
| 11-first active layer; | 12-second active layer; | 13-third active layer; |
| 14-fourth active layer; | 15-fifth active layer; | 16-sixth active layer; |
| 17-seventh active layer; | 21-first scan signal line | 22-second scan signal line |
| 23-light emitting signal line; | 24-first electrode plate; | 31-initial signal line; |
| 32-second electrode plate; | 33-shielding electrode; | 34-opening; |
| 35-electrode plate connection line; | 41-first power line; | 42-data connection electrode; |
| 43-first connection electrode; | 44-second connection electrode; | 45-third connection electrode; |
| 51-data signal line; | 53-anode connection electrode; | 71-anode; |
| 72-pixel definition layer; | 73-pixel opening; | 101-base substrate; |
| 102-drive circuit layer; | 103-light emitting structure layer; | 104-encapsulation layer; |
| 301-anode; | 302-pixel definition layer; | 303-organic emitting layer; |
| 304-cathode; | 401-first encapsulation layer; | 402-second encapsulation layer; |
| 403-third encapsulation layer. | | |

DETAILED DESCRIPTION

Herein, a transistor refers to an element at least including three terminals, i.e., a gate electrode, a drain electrode, and a source electrode. The transistor has a channel region between the drain electrode (drain electrode terminal, drain region, or drain) and the source electrode (source electrode terminal, source region, or source), and a current can flow through the drain electrode, the channel region, and the source electrode. It is to be noted that herein, the channel region refers to a region through which the current mainly flows.

Herein, a first electrode may be the drain electrode and a second electrode may be the source electrode; or, the first electrode may be the source electrode and the second electrode may be the drain electrode. In a case that transistors with opposite polarities are used or that a direction of a current is changed during circuit operation, functions of the "source electrode" and the "drain electrode" may sometimes be exchanged. Therefore, herein, the "source electrode" and the "drain electrode" are interchangeable, and a "source terminal" and a "drain terminal" are interchangeable.

Herein, an "electrical connection" includes a case that constituent elements are connected together through an element with some electrical function. The "element with some electrical function" is not particularly limited as long as it allows sending and receiving of electrical signals between the connected constituent elements. Examples of the "element with some electrical function" include not only an electrode and a wiring, but also a switch element such as a transistor, a resistor, an inductor, a capacitor, other elements with various functions, etc.

Herein, "parallel" refers to a state in which an angle formed by two straight lines is above −10° and below 10°, and thus also includes a state in which the angle is above −5° and below 5°. In addition, "perpendicular" refers to a state in which an angle formed by two straight lines is 80° or more and 100° or less, and thus also includes a state in which the angle is 85° or more and 95° or less.

Herein, a "film" and a "layer" are interchangeable. For example, a "conductive layer" may be replaced with a "conductive film" sometimes. Similarly, an "insulation film" may be replaced with an "insulation layer" sometimes.

FIG. 1 is a schematic diagram of a structure of a display apparatus. As shown in FIG. 1, the display apparatus may include a timing controller, a data signal driver, a scan signal driver, a light emitting signal driver, and a pixel array, wherein the pixel array may include multiple scan signal lines (S1 to Sm), multiple data signal lines (D1 to Dn), multiple light emitting signal lines (E1 to Eo), and multiple sub-pixels Pxij. In an exemplary implementation mode, the timing controller may provide a gray-scale value and a control signal suitable for specification of the data signal driver to the data signal driver, provide a clock signal, a scan starting signal, etc., suitable for specification of the scan signal driver to the scan signal driver, and provide a clock signal, an emission stopping signal, etc., suitable for specification of the light emitting signal driver to the light emitting signal driver. The data signal driver may generate a data voltage to be provided to the data signal lines D1, D2, D3, . . . , and Dn by using the gray-scale value and the control signal that are received from the timing controller. For example, the data signal driver may sample the gray-scale value using the clock signal and apply a data voltage corresponding to the gray-scale value to the data signal lines D1 to Dn by taking a pixel row as a unit, wherein n may be a natural number. The scan signal driver may generate a scan signal to be provided to the scan signal lines S1, S2, S3, . . . , and Sm by receiving the clock signal, the scan starting signal, etc., from the timing controller. For example, the scan signal driver may sequentially provide a scan signal with an on-level pulse to the scan signal lines S1 to Sm. For example, the scan signal driver may be constructed to be in a form of a shift register to generate a scan signal in a manner of sequentially transmitting the scan starting signal provided in a form of an on-level pulse to a next-stage circuit under control of the clock signal, wherein m may be a natural number. The light emitting signal driver may generate an emission signal to be provided to the light emitting signal lines E1, E2, E3, . . . , and Eo by receiving the clock signal, the emission stopping signal, etc., from the timing controller. For example, the light emitting signal driver may sequentially provide an emission signal with an off-level pulse to the light emitting signal lines E1 to Eo. For example, the light emitting signal driver may be constructed to be in a form of a shift register to generate a light emitting signal in a manner of sequentially transmitting a light emitting stopping signal provided in a form of an off-level pulse to a next-stage circuit under control of the clock signal, wherein o may be a natural number. The pixel array may include multiple sub-pixels Pxij. Each sub-pixel Pxij may be connected to a corresponding data signal line, a corresponding scan signal line, and a corresponding light emitting signal line, wherein i and j may be natural numbers. The sub-pixel Pxij may refer to a sub-pixel with a transistor therein being connected to an i-th scan signal line and connected to a j-th data signal line.

Figure 2:
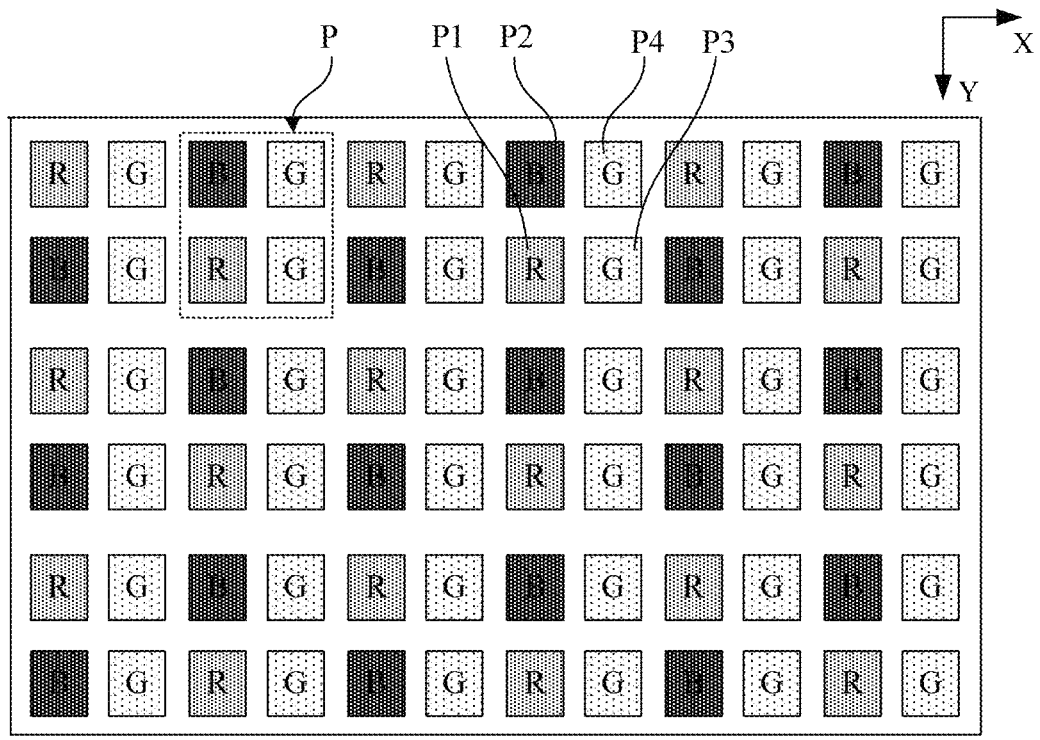
FIG. 2 is a schematic diagram of a structure of a pixel arrangement of a display substrate according to some exemplary embodiments.

FIG. 2 is a schematic diagram of a planar structure of a display substrate. As shown in FIG. 2, the display substrate may include multiple pixel units P arranged in a matrix, wherein each pixel unit P may include one first sub-pixel P1 emitting light of a first color, one second sub-pixel P2 emitting light of a second color, one third sub-pixel P3 emitting light of a third color, and one fourth sub-pixel P4 emitting light of a third color (the third sub-pixel P3 and the fourth sub-pixel P4 both emit light of the third color). Exemplarily, the first sub-pixel P1 may emit red light, the second sub-pixel P2 may emit blue light, and the third sub-pixel P3 and the fourth sub-pixel P4 may emit green light. As shown in FIG. 2, in an exemplary embodiment, all sub-pixels on the display substrate may be arranged in multiple pixel rows and multiple pixel columns, with multiple sub-pixels of a same pixel row arranged along a first direction X and multiple sub-pixels of a same pixel column arranged along a second direction Y, the second direction Y intersects (e.g. may be perpendicular to) the first direction X; any one fourth sub-pixel P4 and a third sub-pixel P3 adjacent to the fourth sub-pixel P4 are located in a same pixel column, and any one fourth sub-pixel P4, and a first sub-pixel P1 and a second sub-pixel P2 adjacent to the fourth sub-pixel P4 are located in a same pixel row. The first sub-pixel P1 and the second sub-pixel P2 are alternately arranged in a same pixel column, and the third sub-pixel P3 and the fourth sub-pixel P4 are alternately arranged in a same pixel column. In an exemplary embodiment, each sub-pixel may include a pixel drive circuit and a light emitting device, wherein the pixel drive circuit in each sub-pixel is connected with a scan signal line, a data signal line, and a light emitting signal line respectively. The pixel drive circuit is configured to receive a data voltage transmitted by the data signal line under control of the scan signal line and the light emitting signal line, and output a corresponding current to the light emitting device. The light emitting device in each sub-pixel is connected with the pixel drive circuit of the sub-pixel where the light emitting device is located respectively, and the light emitting device is configured to emit light with corresponding brightness in response to a current outputted by the pixel drive circuit of the sub-pixel where the light emitting device is located. The light emitting device may be an OLED device, a quantum dot light emitting device, or the like.

Figure 3:
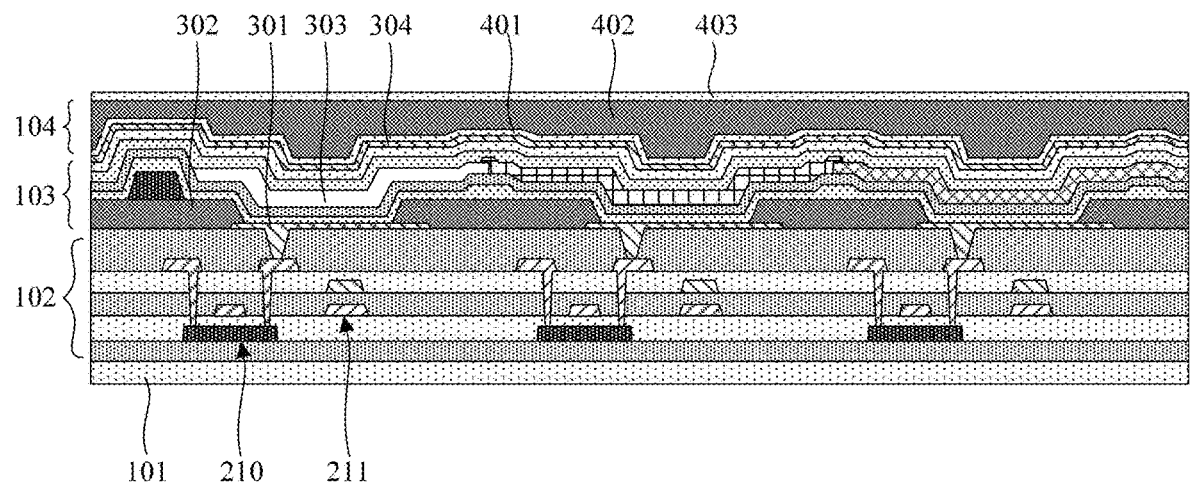
FIG. 3 is a schematic diagram of a sectional structure of a display substrate according to some exemplary embodiments.

FIG. 3 is a schematic diagram of a sectional structure of a display substrate, and illustrates a structure of three sub-pixels of the display substrate. As shown in FIG. 3, in a plane perpendicular to the display substrate, the display substrate may include a drive circuit layer 102 disposed on a base substrate 101, a light emitting structure layer 103 disposed on one side of the drive circuit layer 102 away from the base substrate 101, and an encapsulation layer 104 disposed on one side of the light emitting structure layer 103 away from the base substrate 101. In some possible implementation modes, the display substrate may further include another film layer, such as a pillar spacer, which is not limited in the present disclosure.

In an exemplary implementation mode, the base substrate 101 may be a flexible base substrate, or a rigid base substrate. A drive circuit layer 102 of each sub-pixel may include multiple transistors and a storage capacitor that constitute a pixel drive circuit. In FIG. 3, only one drive transistor 210 and one storage capacitor 211 are taken as an example for illustration. A light emitting structure layer 103 of each sub-pixel may include an anode 301, a pixel definition layer 302, an organic emitting layer 303, and a cathode 304; the anode 301 may be connected with a drain electrode of the drive transistor 210 through a via, the pixel definition layer 302 is provided with a pixel opening, the pixel definition layer 302 covers a portion of the anode 301 close to a circumferential edge, the pixel opening exposes a rest portion of the anode 301, the organic emitting layer 303 is stacked on the anode 301, and the cathode 304 is stacked on the organic emitting layer 303. The anode 301, the organic emitting layer 303, and the cathode 304 are stacked and form a light emitting device, and the organic emitting layer 303 is driven by voltages of the anode 301 and the cathode 304 to emit light of a corresponding color. The encapsulation layer 104 may include a first encapsulation layer 401, a second encapsulation layer 402, and a third encapsulation layer 403 that are stacked, wherein the first encapsulation layer 401 and the third encapsulation layer 403 may be made of an inorganic material, the second encapsulation layer 402 may be made of an organic material, and the second encapsulation layer 402 is arranged between the first encapsulation layer 401 and the third encapsulation layer 403 so as to prevent external water vapor from entering the light emitting structure layer 103.

In an exemplary implementation mode, the light emitting device may further include a hole injection layer, a hole transport layer, and an electron block layer sequentially stacked between the anode 301 and the organic emitting layer 303, and a hole block layer, an electron transport layer, and an electron injection layer sequentially stacked between the organic emitting layer 303 and the cathode 304. In an exemplary implementation mode, hole injection layers of all sub-pixels may be connected as a whole as a common layer of all sub-pixels, and similarly, hole transport layers, electron transport layers, and electron injection layers of all sub-pixels may all be as common layers of all sub-pixels.

Figure 4:
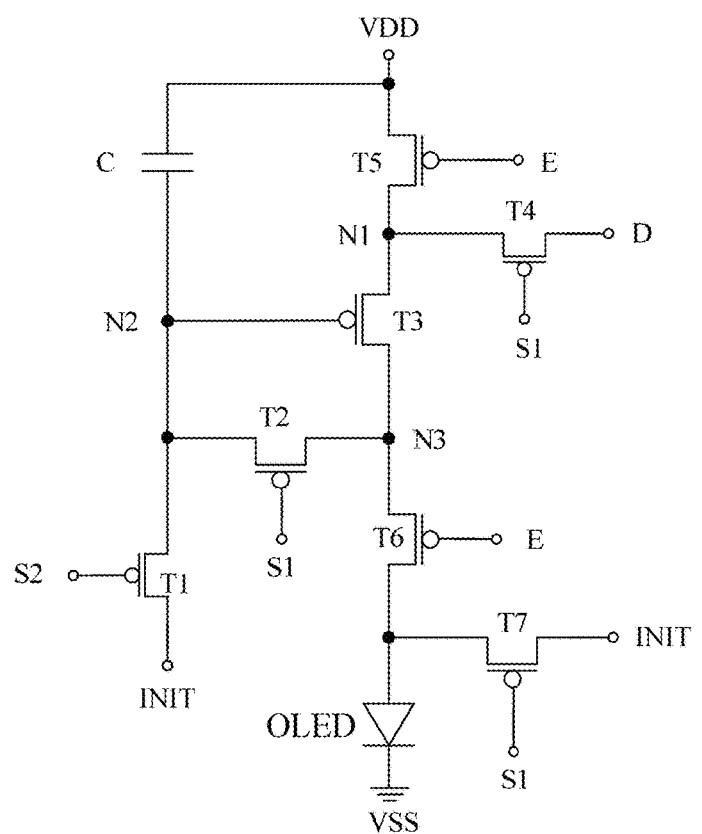
FIG. 4 is a schematic diagram of an equivalent circuit of a pixel drive circuit of a display substrate according to some exemplary embodiments.

In an exemplary implementation mode, the pixel drive circuit may be of a 3T1C, 4T1C, 5T1C, 5T2C, 6T1C, 7T1C, or 8T1C structure. FIG. 4 is a schematic diagram of an equivalent circuit of a pixel drive circuit. As shown in FIG. 4, the pixel drive circuit may include seven transistors (a first transistor T1 to a seventh transistor T7), and one storage capacitor C. The pixel drive circuit is connected with seven signal lines (a data signal line D, a first scan signal line S1, a second scan signal line S2, a light emitting signal line E, an initial signal line INIT, a first power line VDD, and a second power line VSS) and a light emitting device.

In an exemplary implementation mode, a first terminal of the storage capacitor C is connected with the first power line VDD, and a second terminal of the storage capacitor C is connected with a second node N2, namely the second terminal of the storage capacitor C is connected with a gate electrode of the third transistor T3.

A gate electrode of the first transistor T1 is connected with the second scan signal line S2, a first electrode of the first transistor T1 is connected with the initial signal line INIT, and a second electrode of the first transistor is connected with the second node N2. When a scan signal with an on-level is applied to the second scan signal line S2, the first transistor T1 transmits an initial voltage to the gate electrode of the third transistor T3 so as to initialize a charge amount of the gate electrode of the third transistor T3.

A gate electrode of the second transistor T2 (which may be referred to as a compensation transistor) is connected with the first scan signal line S1, a first electrode of the second transistor T2 is connected with the second node N2, and a second electrode of the second transistor T2 is connected with a third node N3. When a scan signal with an on-level is applied to the first scan signal line S1, the second transistor T2 enables the gate electrode of the third transistor T3 to be connected with a second electrode of the third transistor T3.

The gate electrode of the third transistor T3 (which may be referred to as a drive transistor) is connected with the second node N2, namely the gate electrode of the third transistor T3 is connected with the second terminal of the storage capacitor C, a first electrode of the third transistor T3 is connected with a first node N1, and the second electrode of the third transistor T3 is connected with the third node N3. The third transistor T3 may be referred to as a drive transistor, and the third transistor T3 determines an amount of a drive current flowing between the first power line VDD and the second power line VSS according to a potential difference between the gate electrode and the first electrode of the third transistor T3.

A gate electrode of the fourth transistor T4 (which may be referred to as a writing transistor) is connected with the first scan signal line S1, a first electrode of the fourth transistor T4 is connected with the data signal line D, and a second electrode of the fourth transistor T4 is connected with the first node N1. The fourth transistor T4 may be referred to as a switch transistor, a scan transistor, etc., and when a scan signal with an on-level is applied to the first scan signal line S1, the fourth transistor T4 enables a data voltage of the data signal line D to be input to the pixel drive circuit.

A gate electrode of the fifth transistor T5 is connected with the light emitting signal line E, a first electrode of the fifth transistor T5 is connected with the first power line VDD, and a second electrode of the fifth transistor T5 is connected with the first node N1. A gate electrode of the sixth transistor T6 is connected with the light emitting signal line E, a first electrode of the sixth transistor T6 is connected with the third node N3, and a second electrode of the sixth transistor T6 is connected with a first electrode (an anode) of the light emitting device. The fifth transistor T5 and the sixth transistor T6 may be referred to as light emitting transistors. When a light emitting signal with an on-level is applied to the light emitting signal line E, the fifth transistor T5 and the sixth transistor T6 form a drive current path between the first power line VDD and the second power line VSS to enable the light emitting device to emit light.

A gate electrode of the seventh transistor T7 is connected with the first scan signal line S1, a first electrode of the seventh transistor T7 is connected with the initial signal line INIT, and a second electrode of the seventh transistor T7 is connected with the first electrode of the light emitting device. When a scan signal with an on-level is applied to the first scan signal line S1, the seventh transistor T7 transmits an initial voltage to the first electrode of the light emitting device so as to initialize a charge amount accumulated in the first electrode of the light emitting device or release a charge amount accumulated in the first electrode of the light emitting device.

In an exemplary implementation mode, a second electrode (a cathode) of the light emitting device is connected with the second power line VSS, a signal of the second power line VSS is a low-level signal, and a signal of the first power line VDD is a high-level signal continuously provided. The first scan signal line S1 is a scan signal line in a present pixel row, and the second scan signal line S2 is a scan signal line in a previous pixel row. That is, for an n-th pixel row, the first scan signal line S1 is S(n), and the second scan signal line S2 is S(n−1), the second scan signal line S2 of the present pixel row and the first scan signal line S1 of the previous pixel row are a same signal line, which may reduce signal lines of a display panel and achieve a narrow border of the display panel.

In an exemplary implementation mode, the first transistor T1 to the seventh transistor T7 may be P-type transistors or N-type transistors. Use of a same type of transistors in a pixel drive circuit may simplify a process flow, reduce process difficulties of a display panel, and improve a yield of a product. In some possible implementation modes, the first transistor T1 to the seventh transistor T7 may include a P-type transistor and an N-type transistor.

In an exemplary implementation mode, the first transistor T1 to the seventh transistor T7 may be low temperature poly silicon thin film transistors, or may be oxide thin film transistors, or may be low temperature poly silicon thin film transistors and oxide thin film transistors. An active layer of a low temperature poly silicon thin film transistor may be made of Low Temperature Poly Silicon (LTPS for short), and an active layer of an oxide thin film transistor may be made of an oxide semiconductor (Oxide). The low temperature poly silicon thin film transistor has advantages such as a high migration rate and fast charging. The oxide thin film transistor has advantages such as a low leakage current. The low temperature poly silicon thin film transistor and the oxide thin film transistor are integrated on one display substrate to form a Low Temperature Polycrystalline Oxide (LTPO for short) display substrate, so that advantages of the low temperature poly silicon thin film transistor and the oxide thin film transistor may be utilized, low-frequency drive may be realized, power consumption may be reduced, and display quality may be improved.

Figure 5:
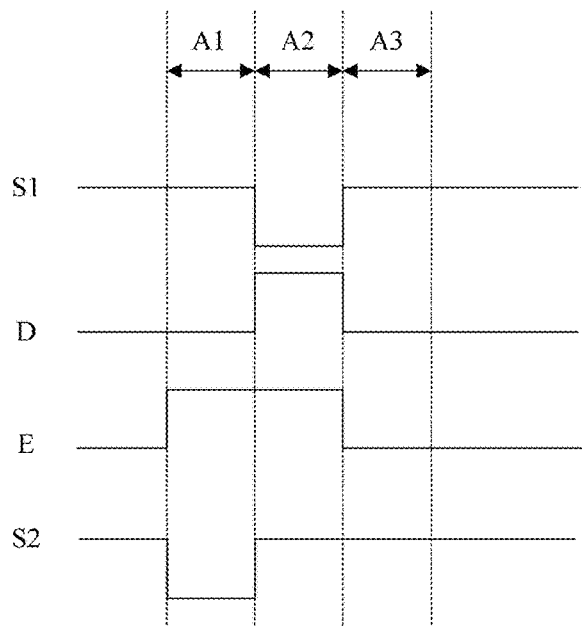
FIG. 5 is a working timing diagram of the pixel drive circuit in FIG. 4 in some exemplary embodiments.

FIG. 5 is a working timing diagram of the pixel drive circuit. A working process of the pixel drive circuit of the example of FIG. 4 will be illustrated with reference to FIG. 5 below. The pixel drive circuit in FIG. 4 includes seven transistors (the first transistor T1 to the seventh transistor T7) and one storage capacitor C, wherein the seven transistors may all be P-type transistors.

In an exemplary implementation mode, the working process of the pixel drive circuit may include following stages.

In a first stage A1, referred to as a reset stage, a signal of the second scan signal line S2 is a low-level signal, and signals of the first scan signal line S1 and the light emitting signal line E are high-level signals. The signal of the second scan signal line S2 is the low-level signal, so that the first transistor T1 is turned on, and a signal of the initial signal line INIT is provided to the second node N2 to initialize the storage capacitor C to clear an original data voltage in the storage capacitor. The signals of the first scan signal line S1 and the light emitting signal line E are high-level signals, so that the second transistor T2, the fourth transistor T4, the fifth transistor T5, the sixth transistor T6, and the seventh transistor T7 are turned off. The light emitting device (taking an OLED device as an example) does not emit light in this stage.

In a second stage A2, referred to as a data writing stage or a threshold compensation stage, a signal of the first scan signal line S1 is a low-level signal, signals of the second scan signal line S2 and the light emitting signal line E are high-level signals, and the data signal line D outputs a data voltage. In this stage, the second terminal of the storage capacitor C is at a low level, so that the third transistor T3 is turned on. The signal of the first scan signal line S1 is the low-level signal, so that the second transistor T2, the fourth transistor T4, and the seventh transistor T7 are turned on. The second transistor T2 and the fourth transistor T4 are turned on, so that a data voltage output by the data signal line D is provided to the second node N2 through the first node N1, the turned-on third transistor T3, the third node N3, and the turned-on second transistor T2, and the storage capacitor C is charged with a difference between the data voltage output by the data signal line D and a threshold voltage of the third transistor T3. A voltage of the second terminal (the second node N2) of the storage capacitor C is Vd−|Vth|, wherein Vd is the data voltage output by the data signal line D, and Vth is the threshold voltage of the third transistor T3. The seventh transistor T7 is turned on, so that an initial voltage of the initial signal line INIT is provided to a first electrode of an OLED to initialize (reset) the first electrode of the OLED and clear a pre-stored voltage therein, thereby completing initialization to ensure that the OLED does not emit light. A signal of the second scan signal line S2 is a high-level signal, so that the first transistor T1 is turned off. A signal of the light emitting signal line E is a high-level signal, so that the fifth transistor T5 and the sixth transistor T6 are turned off.

In a third stage A3, referred to as a light emitting stage. A signal of the light emitting signal line E is a low-level signal, and signals of the first scan signal line S1 and the second scan signal line S2 are high-level signals. The signal of the light emitting signal line E is the low-level signal, so that the fifth transistor T5 and the sixth transistor T6 are turned on, and a power voltage output by the first power line VDD provides a drive voltage to the first electrode of the OLED through the turned-on fifth transistor T5, the third transistor T3, and the sixth transistor T6 to drive the OLED to emit light.

In a drive process of the pixel drive circuit, a drive current flowing through the third transistor T3 (drive transistor) is determined by a voltage difference between a gate electrode and a first electrode of the third transistor T3. A voltage of the second node N2 is Vdata−|Vth|, so that the drive current of the third transistor T3 is as follows.

$$I=K*(Vgs-Vth)^2=K*[(Vdd-Vd+|Vth|)-Vth]^2=K*(Vdd-Vd)^2$$

I is the drive current flowing through the third transistor T3, i.e., a drive current for driving the OLED, K is a constant, Vgs is the voltage difference between the gate electrode and first electrode of the third transistor T3, Vth is the threshold voltage of the third transistor T3, Vd is the data voltage output by the data signal line D, and Vdd is the power voltage output by the first power line VDD.

With reference to FIG. 1 to FIG. 5, in the pixel drive circuit, the gate electrode (N2 node) of the third transistor T3 plays a vital role in a whole circuit. A parasitic capacitance of the N2 node and another node will generate influence on a display effect of pixels, so the parasitic capacitance of the N2 node needs to be considered when designing the pixel drive circuit. In some pixel structures with a GGRB pixel arrangement, since positions of anodes of two G pixels (pixels emitting green light) relative to a pixel drive circuit of a present sub-pixel are different, this will lead to a difference of parasitic capacitances at N2 nodes of the two G pixels. If the difference of the parasitic capacitances at the N2 node of the two G pixels is relatively large, it will cause a relatively large difference in potentials written at the N2 nodes when a signal is written, which will lead to a relatively large difference in currents between the two G pixels when emitting light, and then lead to inconsistent brightness of the two G pixels, affecting a display effect.

An embodiment of the present disclosure provides a display substrate, including: multiple sub-pixels arranged in an array, wherein the multiple sub-pixels include a first sub-pixel emitting light of a first color, a second sub-pixel emitting light of a second color, and a third sub-pixel and a fourth sub-pixel emitting light of a third color; at least one sub-pixel includes a drive circuit layer disposed on a base substrate and a light emitting structure layer disposed on one side of the drive circuit layer away from the base substrate, the drive circuit layer includes a pixel drive circuit, the pixel drive circuit includes a drive transistor and a storage capacitor, and the light emitting structure layer includes a light emitting device connected with the pixel drive circuit; there is a first overlapping region between an orthographic projection of an anode of a light emitting device in the third sub-pixel on the base substrate and an orthographic projection of a gate electrode of a drive transistor in the third sub-pixel on the base substrate; there is no overlapping region between an orthographic projection of an anode of a light emitting device in the fourth sub-pixel on the base substrate and an orthographic projection of a gate electrode of a drive transistor in the fourth sub-pixel on the base substrate; or, there is a second overlapping region between an orthographic projection of an anode of a light emitting device in the fourth sub-pixel on the base substrate and an orthographic projection of a gate electrode of a drive transistor in the fourth sub-pixel on the base substrate, wherein an area of the second overlapping region is smaller than an area of the first overlapping region; the fourth sub-pixel, or the first sub-pixel or the second sub-pixel adjacent to the fourth sub-pixel, includes a conductive block, wherein there is a third overlapping region between an orthographic projection of the conductive block on the base substrate and the orthographic projection of the gate electrode of the drive transistor in the fourth sub-pixel on the base substrate.

For the display substrate of the embodiment of the present disclosure, the third sub-pixel and the fourth sub-pixel both emit light of the third color, and there is no overlapping region or there is a second overlapping region between the orthographic projection of the anode of the light emitting device in the fourth sub-pixel on the base substrate and an orthographic projection of a gate electrode of a drive transistor of a present sub-pixel on the base substrate, wherein an area of the second overlapping region is smaller than an area of the first overlapping region of the third sub-pixel; the fourth sub-pixel, or the first sub-pixel or the second sub-pixel adjacent to the fourth sub-pixel, includes the conductive block, wherein there is the third overlapping region between the orthographic projection of the conductive block on the base substrate and the orthographic projection of the gate electrode of the drive transistor in the fourth sub-pixel on the base substrate. Thus, a parasitic capacitance of the gate electrode of the drive transistor of the adjacent fourth sub-pixel may be compensated by using the conductive block, and a difference in parasitic capacitances of gate electrodes of drive transistors of the fourth sub-pixel and the third sub-pixel may be reduced, thereby decreasing a difference in brightness of the fourth sub-pixel and the third sub-pixel, and improving a display effect.

In some exemplary embodiments, the conductive block is an anode of a light emitting device in a sub-pixel where the conductive block is located; or, a pixel drive circuit of a sub-pixel where the conductive block is located includes the conductive block. In the embodiment, the conductive block may be in a same layer as the anode of the light emitting device or the conductive block and the anode of the light emitting device may be in different layers, and the anode of the light emitting device in the sub-pixel where the conductive block is located may be connected or not connected with the conductive block.

In some exemplary embodiments, a potential of the conductive block may be different from a potential of the anode of the light emitting device in the fourth sub-pixel. In the embodiment, the conductive block may be in a same layer as the anode of the light emitting device in the fourth sub-pixel or the conductive block and the anode of the light emitting device in the fourth sub-pixel may be in different layers, and the conductive block may not be connected with the anode of the light emitting device in the fourth sub-pixel.

In some exemplary embodiments, the first sub-pixel or the second sub-pixel adjacent to the fourth sub-pixel serves as a compensation sub-pixel, and the conductive block is an anode of a light emitting device in the compensation sub-pixel. In an example of the embodiment, potentials of anodes of light emitting devices in the first sub-pixel and the second sub-pixel may be higher than a potential of an anode of a light emitting device in the third sub-pixel, an area of the third overlapping region may be smaller than the area of the first overlapping region. In this way, it is beneficial to reduce a difference in parasitic capacitances of N2 nodes of the third sub-pixel and the fourth sub-pixel, thereby reducing a difference in currents of the third sub-pixel and the fourth sub-pixel, improving consistency of electrical environments of the third sub-pixel and the fourth sub-pixel, and improving consistency of light emitting brightness of the third sub-pixel and the fourth sub-pixel.

In some exemplary embodiments, the light emitting structure layer further includes a pixel definition layer, wherein the pixel definition layer is provided with a pixel opening exposing an anode of the light emitting device; one conductive layer in the drive circuit layer away from the base substrate includes a data signal line; an orthographic projection of at least one of pixel openings on the base substrate avoids an orthographic projection of a wiring of the conductive layer provided with the data signal line on the base substrate, or an orthographic projection of at least one of the pixel openings on the base substrate is bisected by an orthographic projection of a wiring of the conductive layer provided with the data signal line on the base substrate.

In some exemplary embodiments, the drive circuit layer includes a semiconductor layer, a first conductive layer, a second conductive layer, a third conductive layer, and a fourth conductive layer that are sequentially stacked on the base substrate; the semiconductor layer includes an active layer of the drive transistor, the first conductive layer includes a first electrode plate of the storage capacitor and a scan signal line, the second conductive layer includes a second electrode plate of the storage capacitor, the third conductive layer includes a power line, and the fourth conductive layer includes a data signal line; the scan signal line extends along a first direction, and the power line and the data signal line both extend along a second direction, wherein the second direction intersects the first direction.

In some exemplary embodiments, the pixel drive circuit further includes a writing transistor, wherein a gate electrode of the writing transistor is connected with the scan signal line, a first electrode of the writing transistor is connected with the data signal line, and a second electrode of the writing transistor is connected with the first electrode of the drive transistor; an orthographic projection of the anode of the light emitting device in the compensation sub-pixel on the base substrate is also overlapped with an orthographic projection of an active layer of a writing transistor in the adjacent fourth sub-pixel on the base substrate.

In some exemplary embodiments, the pixel drive circuit further includes a compensation transistor, wherein a gate electrode of the compensation transistor is connected with the scan signal line, a first electrode of the compensation transistor is connected with the gate electrode of the drive transistor, and a second electrode of the compensation transistor is connected with the second electrode of the drive transistor; an orthographic projection of the anode of the light emitting device in the compensation sub-pixel on the base substrate is also overlapped with an orthographic projection of an active layer of a compensation transistor in the adjacent fourth sub-pixel on the base substrate.

In some exemplary embodiments, an orthographic projection of the anode of the light emitting device in the compensation sub-pixel on the base substrate is also overlapped with an orthographic projection of an active layer of a compensation transistor in the compensation sub-pixel on the base substrate.

In some exemplary embodiments, an orthographic projection of the anode of the light emitting device in the compensation sub-pixel on the base substrate is also overlapped with an orthographic projection of an active layer of a drive transistor in the compensation sub-pixel on the base substrate.

In some exemplary embodiments, the light emitting structure layer further includes a pixel definition layer, wherein the pixel definition layer is provided with a pixel opening exposing the anode of the light emitting device; the anode of the light emitting device in the compensation sub-pixel includes a second region, and a third protruding part and a fourth protruding part connected with the second region; a shape of the second region is the same as a shape of the pixel opening in the compensation sub-pixel, and an area of the second region is larger than an area of the pixel opening in the compensation sub-pixel; the third protruding part is connected with a pixel drive circuit of the compensation sub-pixel through a via; there is a fourth overlapping region between an orthographic projection of the fourth protruding part on the base substrate and the orthographic projection of the gate electrode of the drive transistor in the adjacent fourth sub-pixel on the base substrate, and the third overlapping region includes the fourth overlapping region.

In some exemplary embodiments, a shape of the second region is a hexagon, and a shape of the fourth protruding part is a trapezoid, wherein two hypotenuse sides of the fourth protruding part are collinear with two sides of the second region respectively.

In some exemplary embodiments, the anode of the light emitting device in the fourth sub-pixel includes a fourth region and a ninth protruding part connected with the fourth region; the ninth protruding part is disposed on one side of the fourth region facing the gate electrode of the drive transistor in the fourth sub-pixel, and is connected with a pixel drive circuit of the fourth sub-pixel through a via.

In some exemplary embodiments, the ninth protruding part includes a first side away from the fourth region, and a second side connected with the fourth region and adjacent to the first side, wherein a chamfer is provided at a connection between the first side and the second side; one side of the fourth protruding part away from the second region is disposed toward the chamfer and is parallel to the chamfer.

In some exemplary embodiments, the pixel drive circuit further includes a compensation transistor, wherein a gate electrode of the compensation transistor is connected with the scan signal line, a first electrode of the compensation transistor is connected with the gate electrode of the drive transistor, and a second electrode of the compensation transistor is connected with the second electrode of the drive transistor; the anode of the light emitting device in the compensation sub-pixel further includes a fifth protruding part and a sixth protruding part connected with the second region, wherein the fifth protruding part and the sixth protruding part are located on opposite sides of the second region; an orthographic projection of the fifth protruding part on the base substrate is overlapped with an orthographic projection of an active layer of a compensation transistor in the adjacent fourth sub-pixel on the base substrate, and an orthographic projection of the sixth protruding part on the base substrate is overlapped with an orthographic projection of an active layer of a compensation transistor in the compensation sub-pixel on the base substrate.

In some exemplary embodiments, an anode of a light emitting device in the third sub-pixel includes a third region, and a seventh protruding part and an eighth protruding part connected with the third region; a shape of the third region is the same as a shape of a pixel opening in the third sub-pixel, and an area of the third region is larger than an area of the pixel opening in the third sub-pixel; the seventh protruding part and the eighth protruding part are located on opposite sides of the third region, the seventh protruding part is connected with a pixel drive circuit of the third sub-pixel through a via, and an orthographic projection of the eighth protruding part on the base substrate is overlapped with an orthographic projection of an active layer of a compensation transistor in the third sub-pixel on the base substrate.

In some exemplary embodiments, the multiple sub-pixels are arranged in multiple pixel rows and multiple pixel columns, multiple sub-pixels of a same pixel row are arranged along a first direction, and multiple sub-pixels of a same pixel column are arranged along a second direction, wherein the second direction intersects the first direction; any one of fourth sub-pixels and a third sub-pixel adjacent to the fourth sub-pixel are located in a same pixel column, and any one of the fourth sub-pixels, and a first sub-pixel and a second sub-pixel adjacent to the fourth sub-pixel are located in a same pixel row.

In some exemplary embodiments, a first sub-pixel and a second sub-pixel are alternately disposed in a same pixel column, and a third sub-pixel and a fourth sub-pixel are alternately disposed in a same pixel column.

In some exemplary embodiments, a first sub-pixel emits red light, a second sub-pixel emits blue light, and a third sub-pixel and a fourth sub-pixel both emit green light.

A structure of the display substrate will be described illustratively below through a preparation process of the display substrate. A "patterning process" mentioned in the present disclosure includes coating with a photoresist, mask exposure, development, etching, photoresist stripping, and other treatments for a metal material, an inorganic material, or a transparent conductive material, and includes coating with an organic material, mask exposure, development, and other treatments for an organic material. Deposition may be any one or more of sputtering, evaporation, and chemical vapor deposition. Coating may be any one or more of spray coating, spin coating, and ink-jet printing. Etching may be any one or more of dry etching and wet etching, which is not limited in present disclosure. A "thin film" refers to a layer of thin film made of a material on a base substrate through a process such as deposition, coating, or the like. If the "thin film" does not need a patterning process in an entire preparation process, the "thin film" may also be called a "layer". If the "thin film" needs the patterning process in the entire preparation process, it is called a "thin film" before the patterning process, and called a "layer" after the patterning process. A "layer" which has experienced a patterning process includes at least one "pattern". "A and B being arranged on a same layer" in the present disclosure means that A and B are formed simultaneously through a same patterning process, and a "thickness" of a film layer is a dimension of the film layer in a direction perpendicular to the display substrate. In an exemplary embodiment of the present disclosure, "an orthographic projection of B is located within a range of an orthographic projection of A" or "an orthographic projection of A contains an orthographic projection of B" refers to a boundary of the orthographic projection of B falling within a range of a boundary of the orthographic projection of A, or the boundary of the orthographic projection of A is overlapped with the boundary of the orthographic projection of B.

In an exemplary implementation mode, the preparation process of the display substrate may include following operations.

Figure 6:
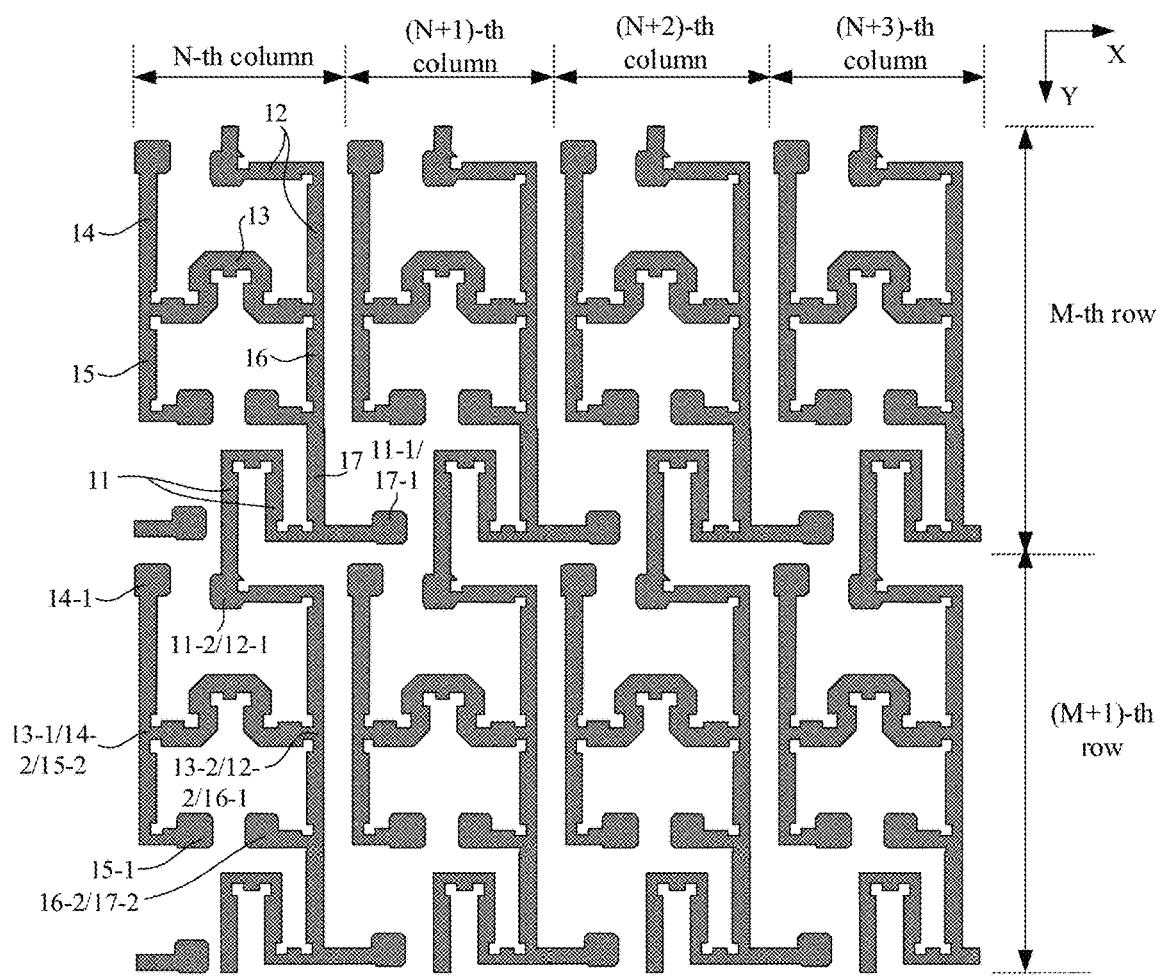
FIG. 6 is a schematic diagram of a display substrate after a pattern of a semiconductor layer is formed according to some exemplary embodiments.

(1) A pattern of a semiconductor layer is formed. In an exemplary embodiment, forming a pattern of a semiconductor layer may include: depositing sequentially a first insulation thin film and a semiconductor thin film on a base substrate, and patterning the semiconductor thin film through a patterning process to form a first insulation layer covering the base substrate and a semiconductor layer disposed on the first insulation layer, as shown in FIG. 6.

In an exemplary embodiment, a semiconductor layer of each sub-pixel may include a first active layer 11 of the first transistor T1 to a seventh active layer 17 of the seventh transistor T7, and the first active layer 11 to the seventh active layer 17 are in an integral structure in which the first active layer 11 to the seventh active layer 17 are connected with each other, and a first active layer 11 of an M-th row of sub-pixels and a second active layer 12 of an (M+1)-th row of sub-pixels in each pixel column are connected with each other.

In an exemplary embodiment, a second active layer 12 and a fourth active layer 14 in an M-th row of sub-pixels are located on one side of a third active layer 13 of a present sub-pixel away from an (M+1)-th row of sub-pixels, and a fifth active layer 15, a sixth active layer 16, a first active layer 11, and a seventh active layer 17 in the M-th row of sub-pixels are located on one side of the third active layer 13 of the present sub-pixel close to the (M+1)-th row of sub-pixels. The first active layer 11 and the seventh active layer 17 are farther away from the third active layer 13 of the present sub-pixel than the fifth active layer 15 and the sixth active layer 16.

In an exemplary embodiment, a shape of the first active layer 11 may be approximately an "n" shape, a shape of the second active layer 12 may be approximately a "7" shape, a shape of the third active layer 13 may be approximately a "a" shape, a shape of the fourth active layer 14 may be approximately a "1" shape, and shapes of the fifth active layer 15, the sixth active layer 16, and the seventh active layer 17 may be approximately an "L" shape.

In an exemplary embodiment, an active layer of each transistor may include a first region, a second region, and a channel region located between the first region and the second region. In an exemplary embodiment, a first region 11-1 of the first active layer 11 also serves as a first region 17-1 of the seventh active layer 17; a second region 11-2 of the first active layer 11 also serves as a first region 12-1 of the second active layer 12; a first region 13-1 of the third active layer 13 also serves as a second region 14-2 of the fourth active layer 14 and a second region 15-2 of the fifth active layer 15; a second region 13-2 of the third active layer 13 also serves as a second region 12-2 of the second active layer 12 and a first region 16-1 of the sixth active layer 16; a second region 16-2 of the sixth active layer 16 also serves as a second region 17-2 of the seventh active layer 17. In the exemplary embodiment, a first region 14-1 of the fourth active layer 14 and a first region 15-1 of the fifth active layer 15 are arranged separately.

Figure 7A:
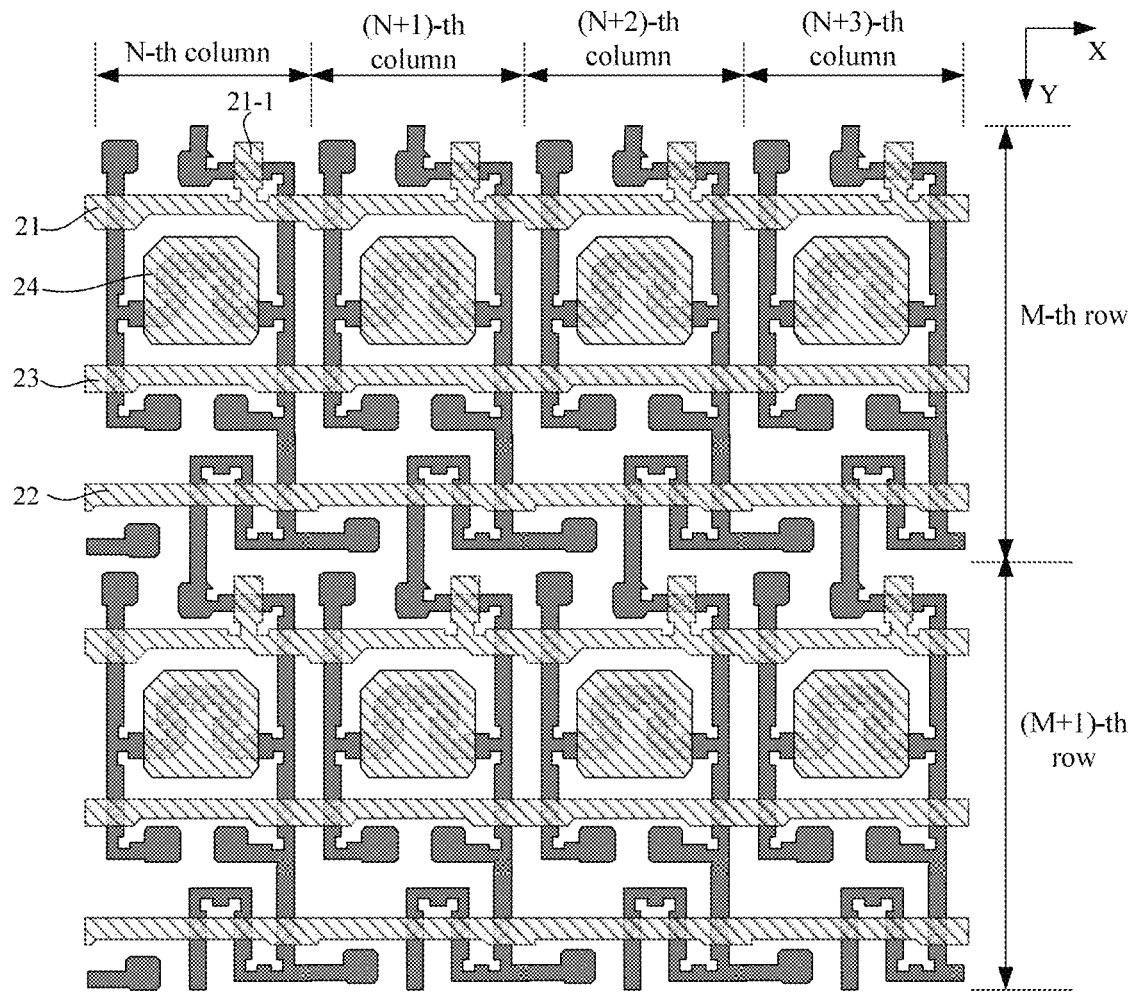
FIG. 7a is a schematic diagram of a display substrate after a pattern of a first conductive layer is formed according to some exemplary embodiments.
Figure 7B:
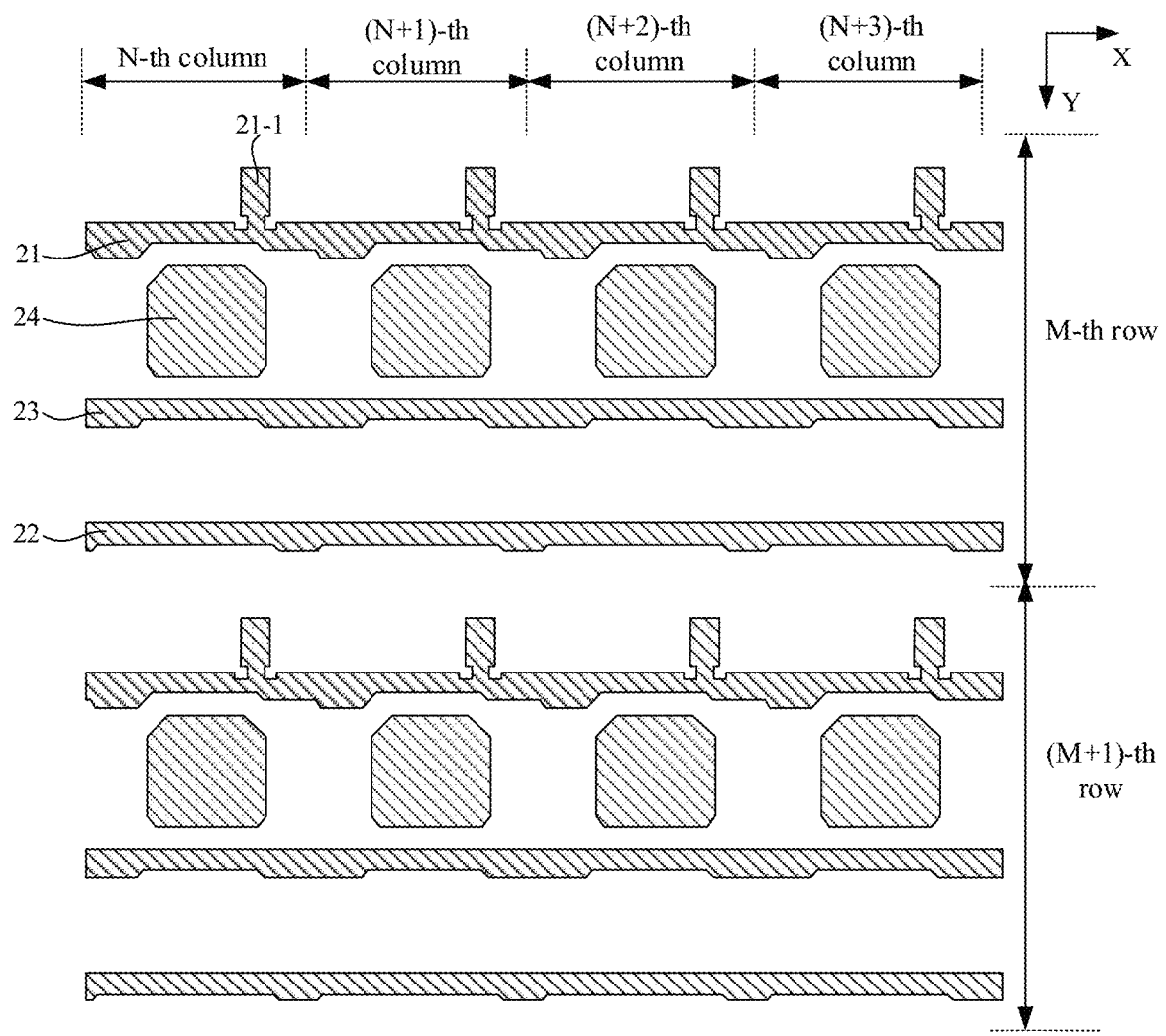

(2) A pattern of a first conductive layer is formed. In an exemplary embodiment, forming a pattern of a first conductive layer may include: a second insulation thin film and a first conductive thin film are sequentially deposited on the base substrate on which the aforementioned pattern is formed, and the first conductive thin film is patterned through a patterning process to form a second insulation layer that covers the pattern of the semiconductor layer, and the pattern of the first conductive layer disposed on the second insulation layer, wherein the pattern of the first conductive layer at least includes a first scan signal line 21, a second scan signal line 22, a light emitting signal line 23, and a first electrode plate 24, as shown in FIG. 7a and FIG. 7b. FIG. 7b is a schematic plan view of the first conductive layer in FIG. 7a. In an exemplary embodiment, the first conductive layer may be called a first gate metal (GATE1) layer.

As shown in FIG. 6 to FIG. 7b, the first scan signal line 21, the second scan signal line 22, and the light emitting signal line 23 may extend along a first direction X. A first scan signal line 21 in the M-th row of sub-pixels is located on one side of a first electrode plate 24 of the present sub-pixel away from the (M+1)-th row of sub-pixels, and the light emitting signal line 23 and the second scan signal line 22 may be located on one side of the first electrode plate 24 of the present sub-pixel close to the (M+1)-th row of sub-pixels, and the light emitting signal line 23 is closer to the first electrode plate 24 of the present sub-pixel than the second scan signal line 22.

In an exemplary implementation mode, the first electrode plate 24 may be in a shape of a rectangle, and corners of the rectangle may be provided with chamfers. There is an overlapping region between an orthographic projection of the first electrode plate 24 on the base substrate and an orthographic projection of a third active layer of the third transistor T3 on the base substrate. In an exemplary embodiment, the first electrode plate 24 may simultaneously serve as one electrode plate of the storage capacitor and the gate electrode of the third transistor T3.

In an exemplary embodiment, a region in which the first scan signal line 21 is overlapped with the second active layer 12 serves as a gate electrode of the second transistor T2. The first scan signal line 21 is disposed with a gate block 21-1 protruding towards one side on which the second scan signal line 22 is located, and there is an overlapping region between an orthographic projection of the gate block 21-1 on the base substrate and an orthographic projection of the second active layer 12 on the base substrates. In each sub-pixel, the first scan signal line 21 and the second active layer 12 have two overlapping regions, wherein the two overlapping regions form a double gate structure of the second transistor T2. A region in which the first scan signal line 21 is overlapped with the fourth active layer 14 serves as a gate electrode of the fourth transistor T4. A region in which the second scan signal line 22 is overlapped with the first active layer 11 serves as a gate electrode of the first transistor T1 of a double gate structure, a region in which the second scan signal line 22 is overlapped with the seventh active layer 17 serves as a gate electrode of the seventh transistor T7, a region in which the light emitting signal line 23 is overlapped with the fifth active layer 15 serves as a gate electrode of the fifth transistor T5, and a region in which the light emitting signal line 23 is overlapped with the sixth active layer 16 serves as a gate electrode of the sixth transistor T6.

In an exemplary embodiment, after the pattern of the first conductive layer is formed, the semiconductor layer may be subjected to a conductive treatment by using the first conductive layer as a shield. A region of the semiconductor layer, which is shielded by the first conductive layer, forms channel regions of the first transistor T1 to the seventh transistor T7, and a region of the semiconductor layer, which is not shielded by the first conductive layer, is made to be conductive, that is, first regions and second regions of the first active layer to the seventh active layer are all made to be conductive.

Figure 8A:
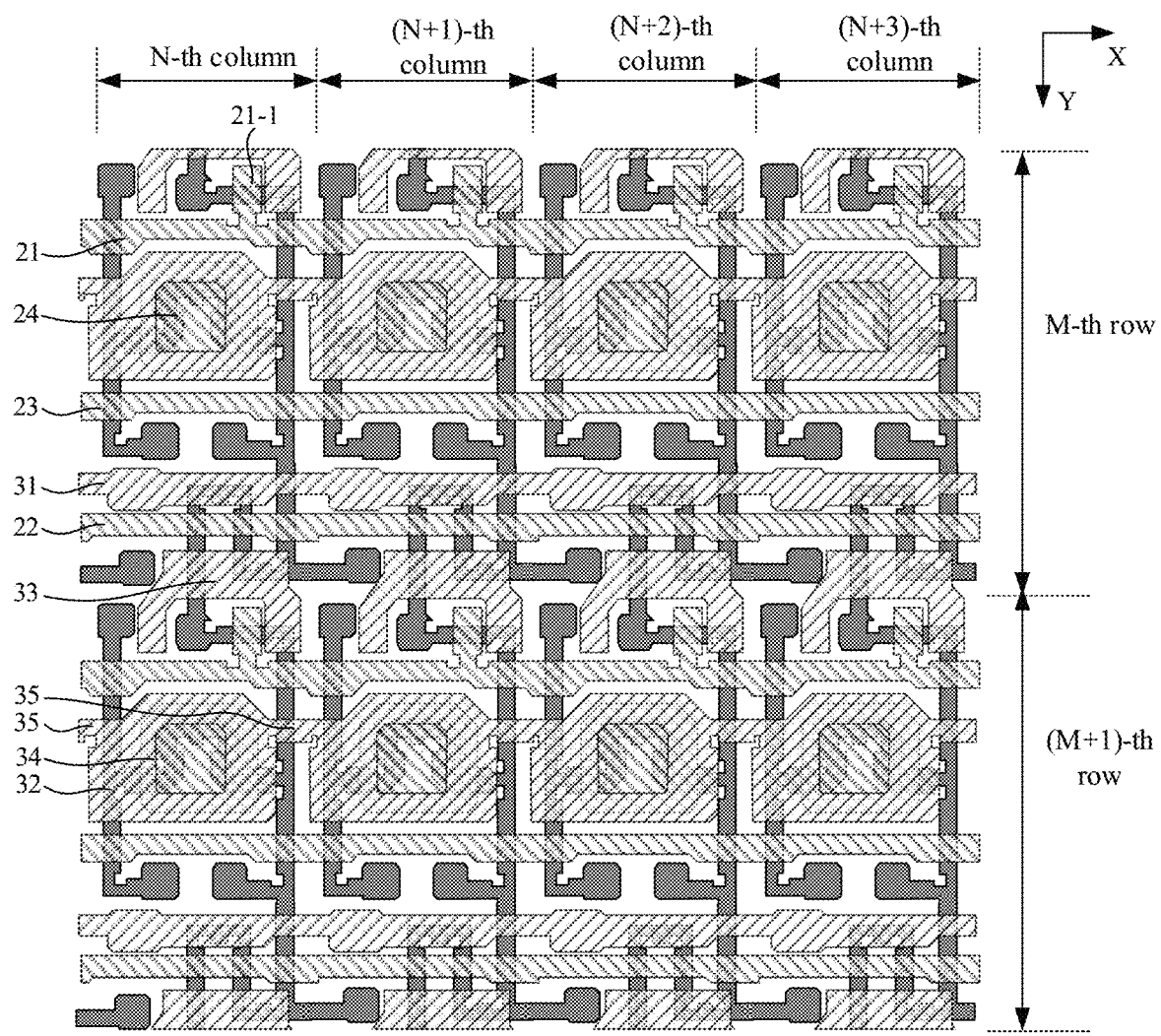
FIG. 8a is a schematic diagram of a display substrate after a pattern of a second conductive layer is formed according to some exemplary embodiments.
Figure 8B:
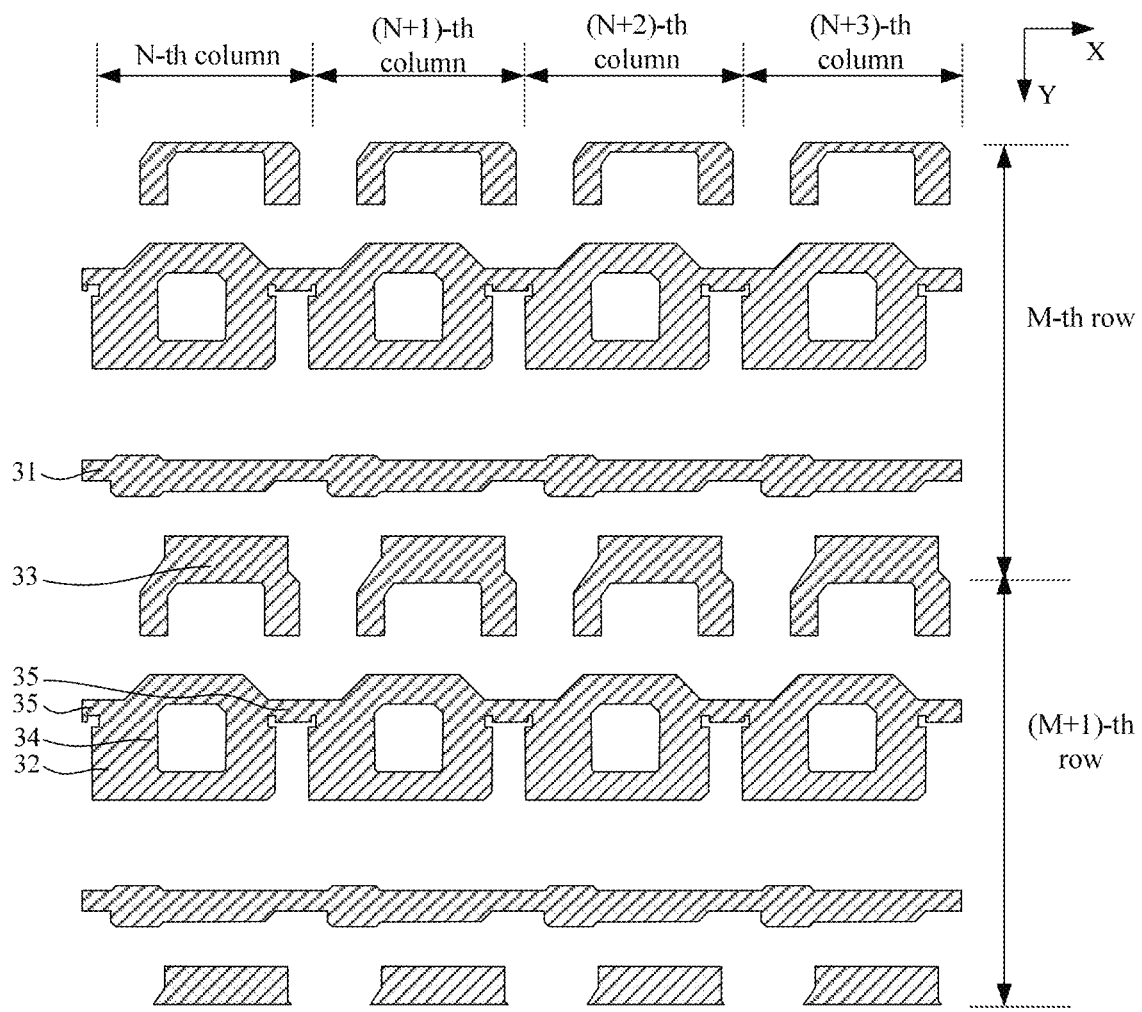

(3) A pattern of a second conductive layer is formed. In an exemplary embodiment, forming a pattern of a second conductive layer may include: a third insulation thin film and a second conductive thin film are sequentially deposited on the base substrate on which the aforementioned patterns are formed, and the second conductive thin film is patterned through a patterning process to form a third insulation layer that covers the first conductive layer and the pattern of the second conductive layer disposed on the third insulation layer, wherein the pattern of the second conductive layer at least includes: an initial signal line 31, a second electrode plate 32, a shielding electrode 33, and an electrode plate connection line 35, as shown in FIG. 8a and FIG. 8b. FIG. 8b is a schematic plan view of the second conductive layer in FIG. 8a. In an exemplary embodiment, the second conductive layer may be called a second gate metal (GATE 2) layer.

As shown in FIG. 6 to FIG. 8b, the initial signal line 31 may extend along the first direction X, and an initial signal line 31 in the M-th row of sub-pixels is located on one side of a second scan signal line 22 of the present sub-pixel away from the (M+1)-th row of sub-pixels. The second electrode plate 32 serves as another electrode plate of the storage capacitor and is located between a first scan signal line 21 and a light emitting signal line 23 of the present sub-pixel. The shielding electrode 33 is located on one side of the first scan signal line 21 of the present pixel away from the second electrode plate 32. The shielding electrode 33 is configured to shield an influence of a jumping change of a data voltage on a key node, preventing the jumping change of the data voltage from affecting a potential of the key node of a pixel drive circuit, and improving a display effect.

In an exemplary embodiment, an outline of the second electrode plate 32 may be in the shape of a rectangle, corners of which may be provided with chamfers, there is an overlapping region between an orthographic projection of the second electrode plate 32 on the base substrate and an orthographic projection of the first electrode plate 24 on the base substrate exists, and the first electrode plate 24 and the second electrode plate 32 construct the storage capacitor of the pixel drive circuit. An opening 34 is disposed on the second electrode plate 32, and the opening 34 may be located in a middle of the second electrode plate 32. The opening 34 may be rectangular, so that the second electrode plate 32 forms an annular structure. The opening 34 exposes the third insulation layer covering the first electrode plate 24, and the orthographic projection of the first electrode plate 24 on the base substrate contains an orthographic projection of the opening 34 on the base substrate. In an exemplary embodiment, the opening 34 is configured to accommodate a first via subsequently formed, the first via is configured to be located in the opening 34 and expose the first electrode plate 24, so that a second electrode of the first transistor T1 subsequently formed is connected with the first electrode plate 24.

In an exemplary embodiment, the electrode plate connection line 35 is disposed between second electrode plates 32 of adjacent sub-pixels in the first direction X, a first terminal of the electrode plate connection line 35 is connected with a second electrode plate 32 of the present sub-pixel, and a second terminal of the electrode plate connection line 35 extends along the first direction X or an opposite direction of the first direction X and is connected with a second electrode plates 32 of an adjacent sub-pixel, that is, the electrode plate connection line 35 is configured to make second electrode plates of adjacent sub-pixels in one pixel row be connected with each other. In an exemplary embodiment, second electrode plates of multiple sub-pixels in one pixel row may be connected with each other to form an integral structure through the electrode plate connection line 35, and the second electrode plates of the integral structure may be reused as power signal lines, ensuring that second electrode plates of multiple sub-pixels in one pixel row have a same potential, which is beneficial to improving uniformity of a panel, avoiding poor display of the display substrate, and ensuring a display effect of the display substrate.

Figure 9A:
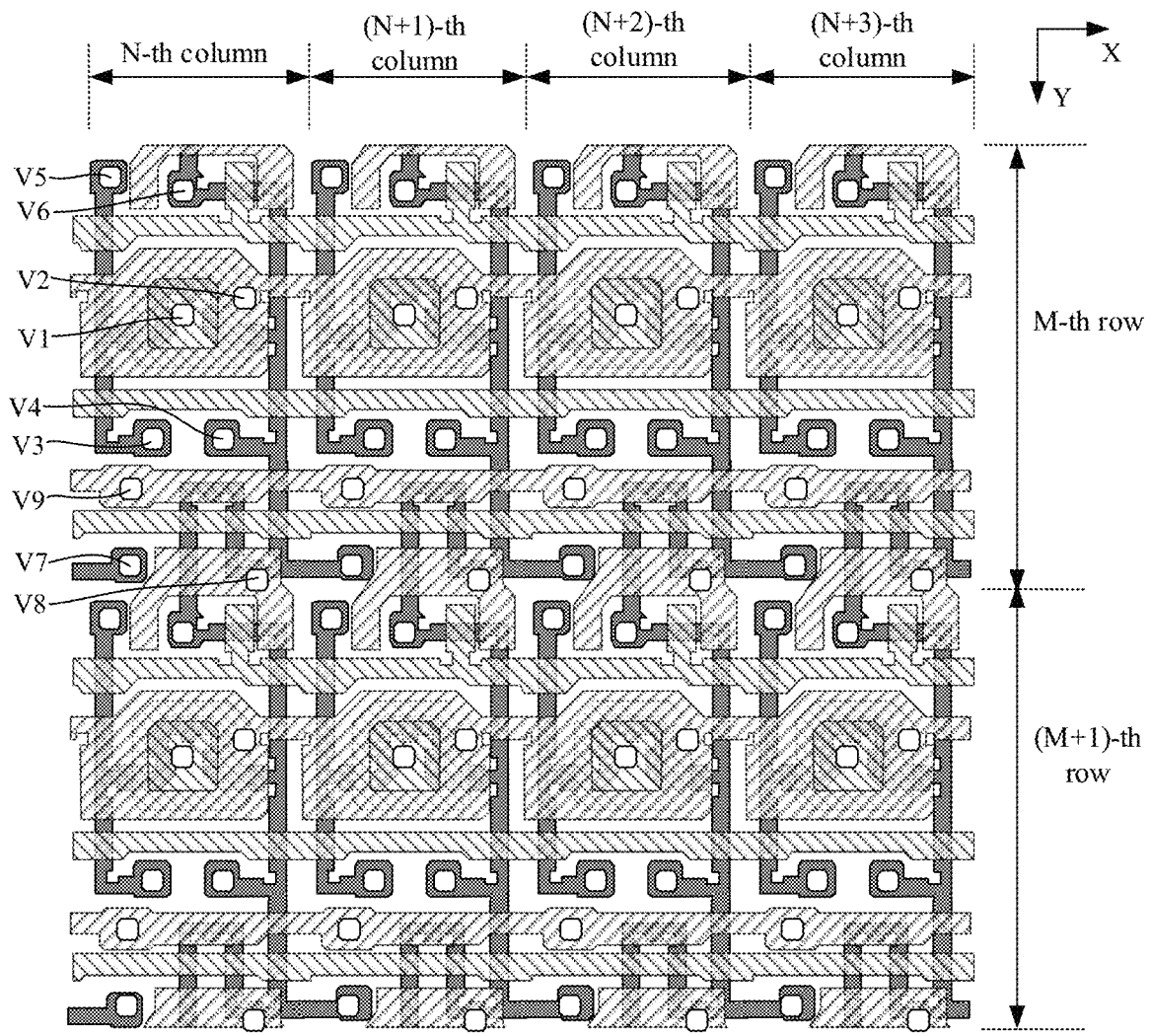
FIG. 9a is a schematic diagram of a display substrate after a pattern of a fourth insulation layer is formed according to some exemplary embodiments.
Figure 9B:
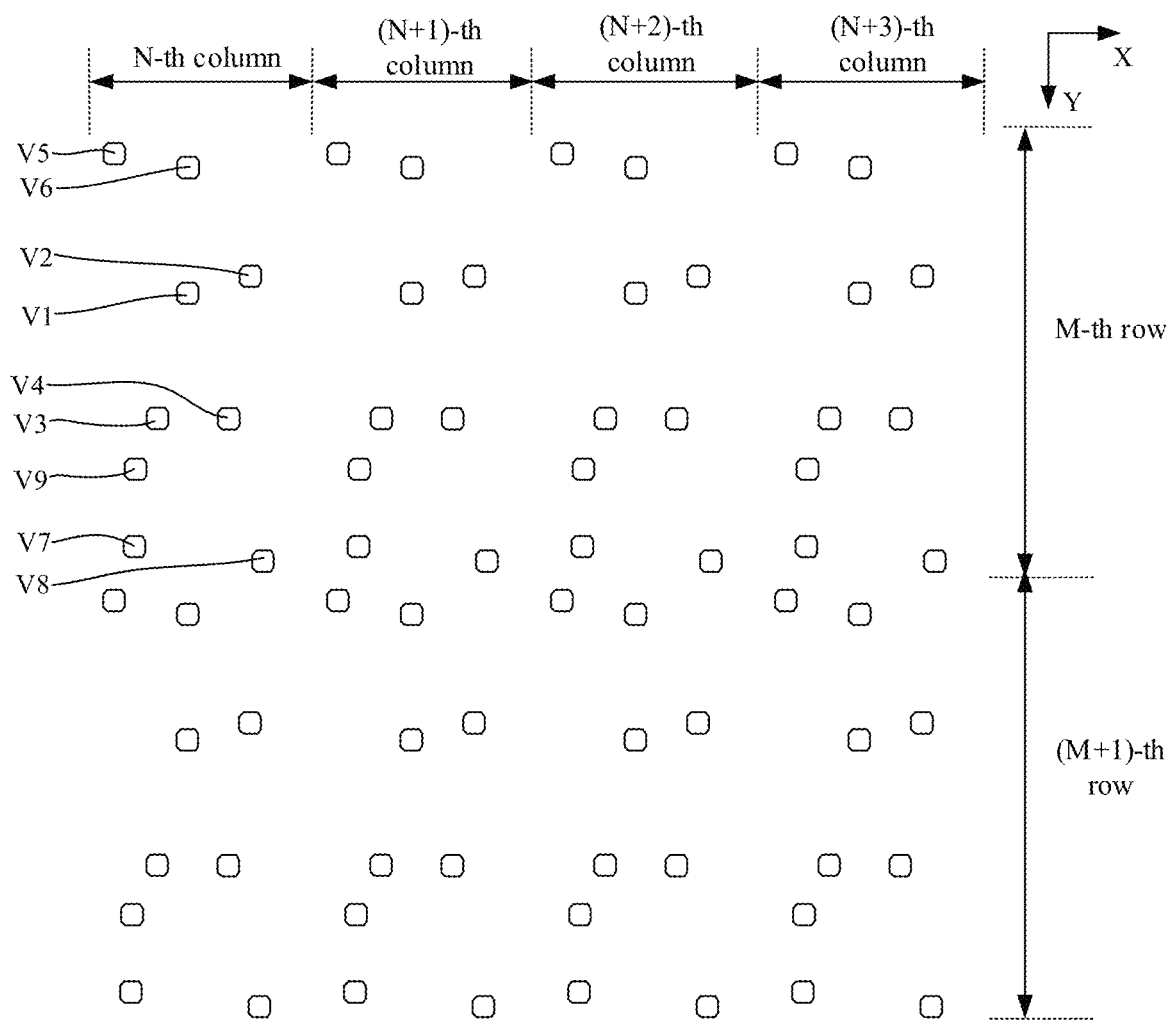

(4) A pattern of a fourth insulation layer is formed. In an exemplary embodiment, forming the pattern of the fourth insulation layer may include: a fourth insulation thin film is deposited on the base substrate on which the aforementioned patterns are formed, and the fourth insulation thin film is patterned through a patterning process to form the fourth insulation layer that covers the second conductive layer, wherein a fourth insulation layer of each sub-pixel is provided with multiple vias, the multiple vias at least include a first via V1, a second via V2, a third via V3, a fourth via V4, a fifth via V5, a sixth via V6, a seventh via V7, an eighth via V8, and a ninth via V9, as shown in FIG. 9*a* and FIG. 9*b*. FIG. 9*b* is a schematic plan view of the multiple vias of the fourth insulation layer in FIG. 9*a*.

As shown in FIG. 6 to FIG. 9*b*, the first via V1 is located in the opening 34 of the second electrode plate 32, and an orthographic projection of the first via V1 on the base substrate is located within a range of the orthographic projection of the opening 34 on the base substrate. The fourth insulation layer and the third insulation layer in the first via V1 are etched off to expose a surface of the first electrode plate 24. The first via V1 is configured such that a second electrode of the first transistor T1 to be formed subsequently is connected with the first electrode plate 24 through the via.

In an exemplary embodiment, the second via V2 is located in a region where the second electrode plate 32 is located, and an orthographic projection of the second via V2 on the base substrate is within a range of the orthographic projection of the second electrode plate 32 on the base substrate. The fourth insulation layer in the second via V2 is etched off to expose a surface of the second electrode plate 32. The second via V2 is configured such that a first power line to be formed subsequently is connected with the second electrode plate 32 through the via. In an exemplary embodiment, the second via V2 as a power via may be multiple, and the multiple second vias V2 may be sequentially arranged along the second direction Y, to increase connection reliability between the first power line and the second electrode plate 32.

In an exemplary embodiment, the third via V3 is located in a region in which the fifth active layer is located, and the fourth insulation layer, the third insulation layer, and the second insulation layer in the third via V3 are etched off to expose a surface of a first region of the fifth active layer. The third via V3 is configured such that the first power line to be formed subsequently is connected with the fifth active layer through the via.

In an exemplary embodiment, the fourth via V4 is located in a region in which the sixth active layer is located, and the fourth insulation layer, the third insulation layer, and the second insulation layer in the fourth via V4 are etched off to expose a surface of a second region of the sixth active layer (i.e., a second region of the seventh active layer). The fourth via V4 is configured such that a second electrode of the sixth transistor T6 subsequently formed is connected with the sixth active layer through the via and a second electrode of the seventh transistor T7 subsequently formed is connected with the seventh active layer through the via.

In an exemplary embodiment, the fifth via V5 is located in a region in which the fourth active layer is located, and the fourth insulation layer, the third insulation layer, and the second insulation layer in the fifth via V5 are etched off to expose a surface of a first region of the fourth active layer. The fifth via V5 is configured such that a data signal line to be formed subsequently is connected with the fourth active layer through the via, wherein the fifth via V5 is called a data writing hole.

In an exemplary embodiment, the sixth via V6 is located in a region in which the second active layer is located, and the fourth insulation layer, the third insulation layer, and the second insulation layer in the sixth via V6 are etched off to expose a surface of a first region of the second active layer (i.e., a second region of the first active layer). The sixth via V6 is configured such that a second electrode of the first transistor T1 subsequently formed is connected with the first active layer through the via and a first electrode of the second transistor T2 subsequently formed is connected with the second active layer through the via.

In an exemplary embodiment, the seventh via V7 is located in a region in which the seventh active layer is located, and the fourth insulation layer, the third insulation layer, and the second insulation layer in the seventh via V7 are etched off to expose a surface of a first region of the seventh active layer (i.e., a first region of the first active layer). The seventh via V7 is configured such that a first electrode of the seventh transistor T7 subsequently formed is connected with the seventh active layer through the via and a first electrode of the first transistor T1 subsequently formed is connected with the first active layer through the via.

In an exemplary embodiment, the eighth via V8 is located in a region in which the shielding electrode 33 is located, and the fourth insulation layer in the eighth via V8 is etched off to expose a surface of the shielding electrode 33. The eighth via V8 is configured such that the first power line to be formed subsequently is connected with the shielding electrode 33 through the via.

In an exemplary embodiment, the ninth via V9 is located in a region in which the initial signal line 31 is located, and the fourth insulation layer in the ninth via V9 is etched off to expose a surface of the initial signal line 31. The ninth via V9 is configured such that the first electrode of the seventh transistor T7 (i.e., the first electrode of the first transistor T1) to be formed subsequently is connected with the initial signal line 31 through the via.

Figure 10A:
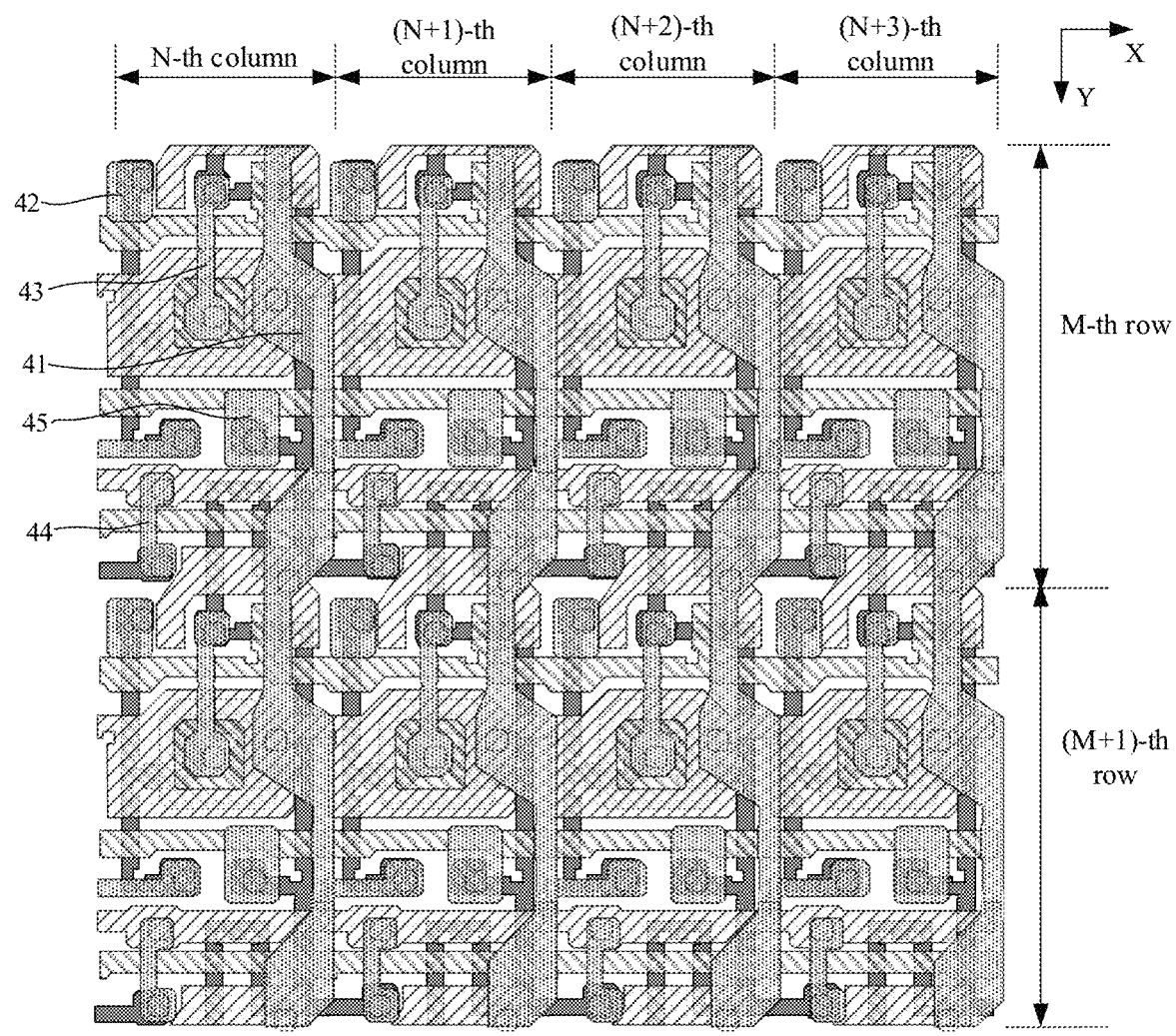
FIG. 10a is a schematic diagram of a display substrate after a pattern of a third conductive layer is formed according to some exemplary embodiments.
Figure 10B:
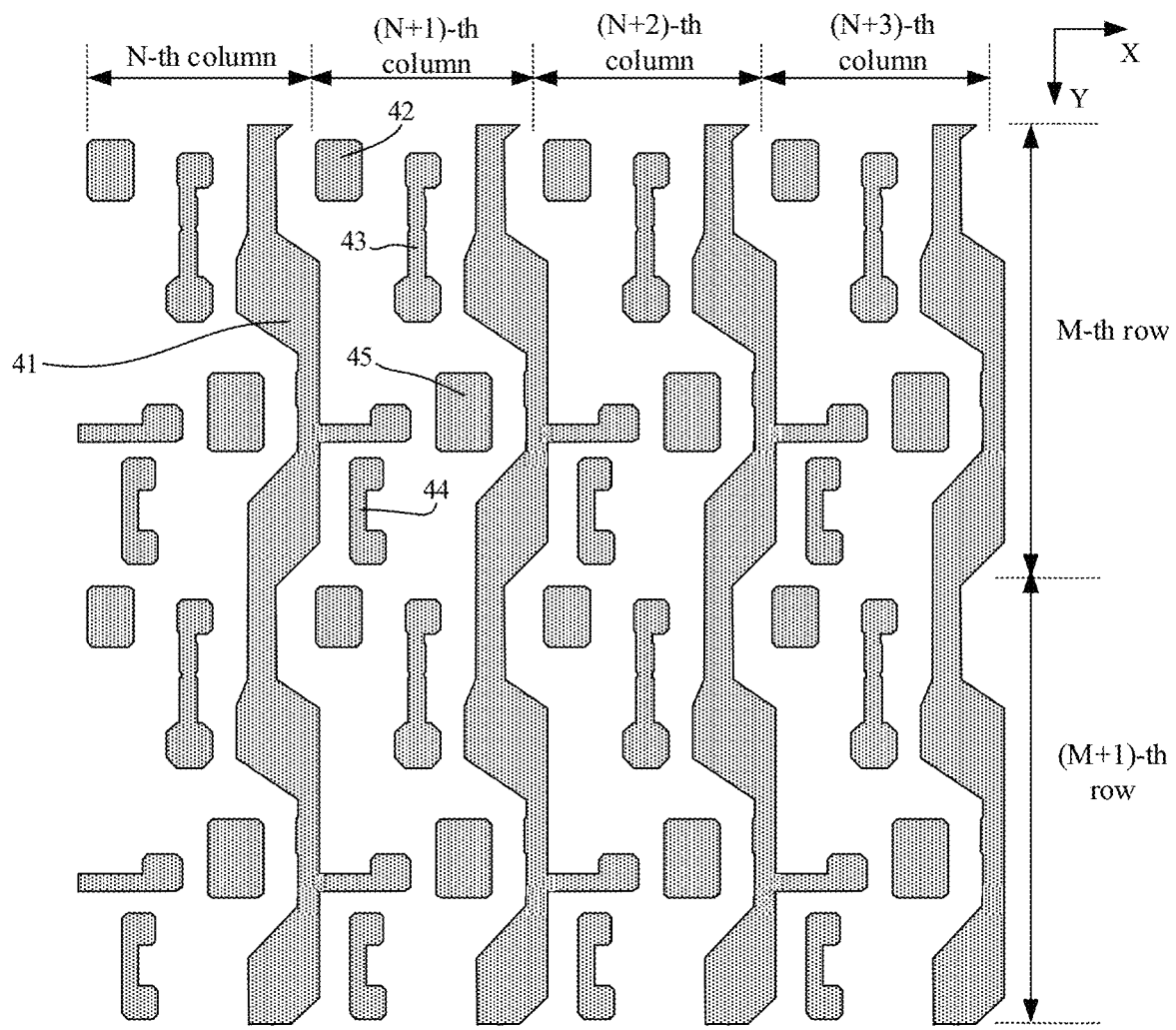

(5) A pattern of a third conductive layer is formed. In an exemplary embodiment, forming the pattern of the third conductive layer may include: a third conductive thin film is deposited on the base substrate on which the aforementioned patterns are formed, and the third conductive thin film is patterned through a patterning process to form the third conductive layer disposed on the fourth insulation layer, wherein the third conductive layer at least includes a first power line 41, a data connection electrode 42, a first connection electrode 43, a second connection electrode 44, and a third connection electrode 45, as shown in FIG. 10*a* and FIG. 10*b*. FIG. 10*b* is a schematic plan view of the third conductive layer in FIG. 10a. In an exemplary embodiment, the third conductive layer may be called a first source drain metal (SD1) layer.

As shown in FIG. 6 to FIG. 10b, the first power line 41 extends along the second direction Y. On one hand, the first power line 41 is connected with the second electrode plate 32 through the second via V2, and on another hand, the first power line 41 is connected with the fifth active layer through the third via V3, and on another hand, is connected with the shielding electrode 33 through the eighth via V8, so that the shielding electrode 33 and the second electrode plate 32 have a same potential as the first power line 41. There is an overlapping region between an orthographic projection of the shielding electrode 33 on the base substrate and an orthographic projection of a data signal line to be formed subsequently on the base substrate exists, and the shielding electrode 33 is connected with the first power line 41, which may effectively shield an influence of a jumping change of a data voltage on a key node in the pixel drive circuit, and prevent the jumping change of the data voltage from affecting a potential of the key node of the pixel drive circuit, improving a display effect.

In an exemplary embodiment, the data connection electrode 42 is connected with a first region of the fourth active layer through the fifth via V5 and is configured to be connected with the data signal line formed subsequently.

In an exemplary embodiment, the first connection electrode 43 extends along the second direction Y, a first terminal of the first connection electrode 43 is connected with a second region of the first active layer (also a first region of the second active layer) through the sixth via V6, and a second terminal of the first connection electrode 43 is connected with the first electrode plate 24 through the first via V1. The first connection electrode 43 may serve as a second electrode of the first transistor T1 and a first electrode of the second transistor T2, so that the first electrode plate 24, the second electrode of the first transistor T1, and the first electrode of the second transistor T2 have a same potential.

In an exemplary embodiment, a first terminal of the second connection electrode 44 is connected with the initial signal line 31 through the ninth via V9, and a second terminal of the second connection electrode 44 is connected with a first region of the seventh active layer (also a first region of the first active layer) through the seventh via V7. The second connection electrode 44 may serve as a first electrode of the seventh transistor T7 and a first electrode of the first transistor T1, so that the first electrode of the seventh transistor T7 and the first electrode of the first transistor T1 have a same potential as the initial signal line 31.

In an exemplary embodiment, the third connection electrode 45 is connected with a second region of the sixth active layer (also a second region of the seventh active layer) through the fourth via V4. The third connection electrode 45 may serve as a second electrode of the sixth transistor T6 and a second electrode of the seventh transistor T7, so that the second electrode of the sixth transistor T6 and the second electrode of the seventh transistor T7 have a same potential. In an exemplary embodiment, the third connection electrode 45 is further configured to be connected with an anode connection electrode subsequently formed.

In an exemplary embodiment, a first power line 41 of each sub-pixel may be a zigzag line with unequal widths. Along the second direction Y, the first power line 41 of each sub-pixel may include a first power portion, a second power portion, a third power, and a fourth power portion sequentially connected, wherein the first power portion and the third power portion may be parallel to the second direction Y, the first power portion and the third power portion are not collinear in the second direction Y, the third power portion has an offset in the first direction X compared with the first power portion, the second power portion and the fourth power portion are both arranged obliquely, and the second power portion and the fourth power portion may be symmetrically disposed with respect to a center line of the third power portion along the first direction X. A fourth power portion of a first power line 41 of an M-th row of sub-pixels of multiple sub-pixels in a same column is connected with a first power portion of a first power line 41 of an (M+1)-th row of sub-pixels. An included angle between the second power portion and the first power portion may be greater than 0° and less than 90°. An included angle between the fourth power portion and the third power portion may be greater than 0° and less than 90°. The third power portion is provided with a connection portion extending toward the first direction X, wherein the connection portion is configured to be connected with the fifth active layer through the third via. The first power line 41 is disposed as a zigzag line, which may facilitate a layout of a pixel structure, and may also reduce a parasitic capacitance between the first power line and the data signal line subsequently formed.

Figure 11A:
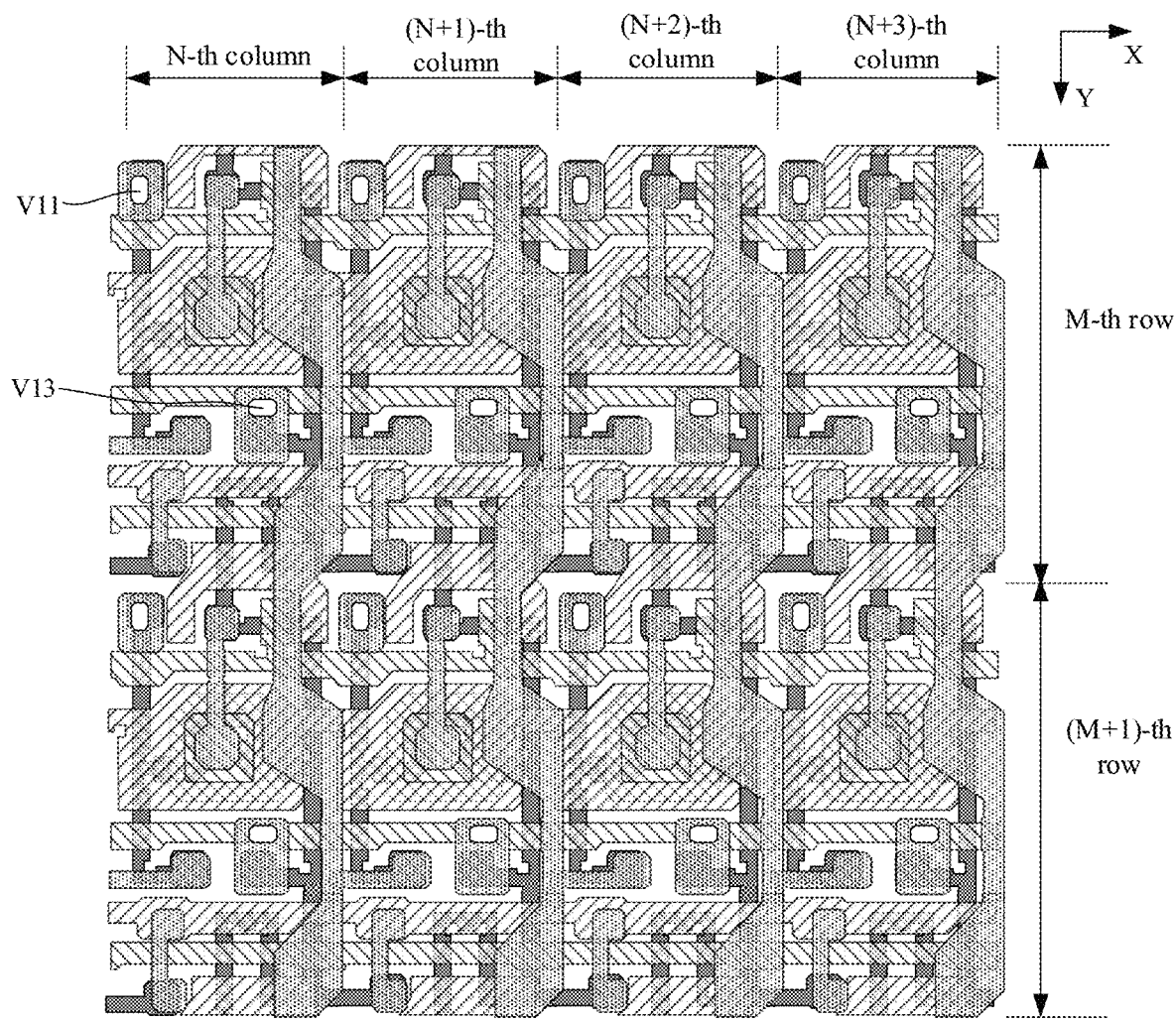
FIG. 11a is a schematic diagram of a display substrate after a pattern of a first planarization layer is formed according to some exemplary embodiments.
Figure 11B:
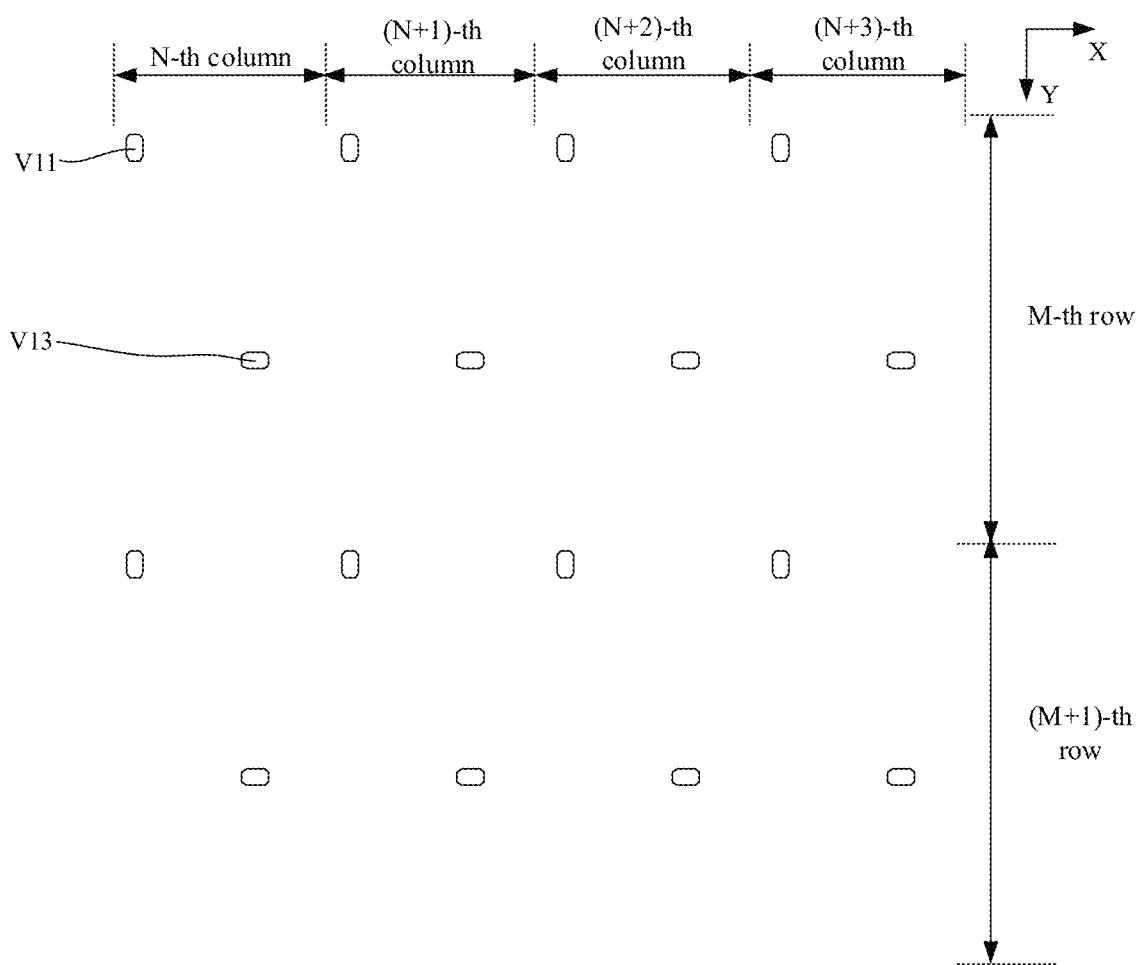

(6) A pattern of a first planarization layer is formed. In an exemplary embodiment, forming the pattern of the first planarization layer may include: a first planarization thin film is coated on the base substrate on which the aforementioned patterns are formed, and the first planarization thin film is patterned through a patterning process to form the first planarization layer that covers the third conductive layer, wherein a first planarization layer of each sub-pixel is provided with an eleventh via V11 and a thirteenth via V13, as shown in FIG. 11a and FIG. 11b. FIG. 11b is a schematic plan view of multiple vias of the first planarization layer in FIG. 11a.

As shown in FIG. 6 to FIG. 11b, the eleventh via V11 is located in a region in which the data connection electrode 42 is located, the first planarization layer in the eleventh via V11 is removed to expose a surface of the data connection electrode 42, and the eleventh via V11 is configured such that the data signal line to be formed subsequently is connected with the data connection electrode 42 through the via.

The thirteenth via V13 is located in a region in which the third connection electrode 45 is located, the first planarization layer in the thirteenth via V13 is removed to expose a surface of the third connection electrode 45, and the thirteenth via V13 is configured such that an anode connection electrode to be formed subsequently is connected with the third connection electrode 45 through the via.

Figure 12A:
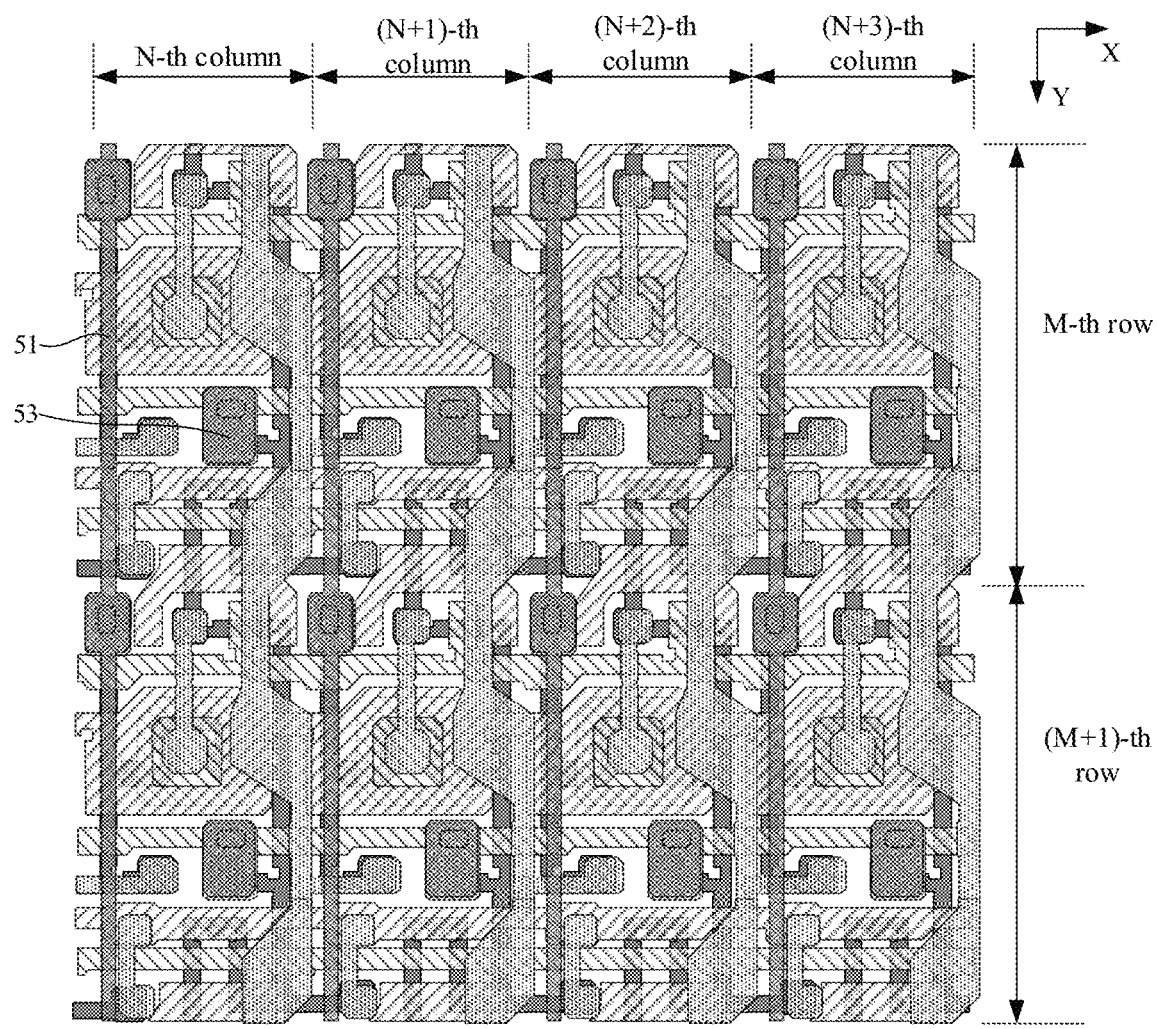
FIG. 12a is a schematic diagram of a display substrate after a pattern of a fourth conductive layer is formed according to some exemplary embodiments.
Figure 12B:
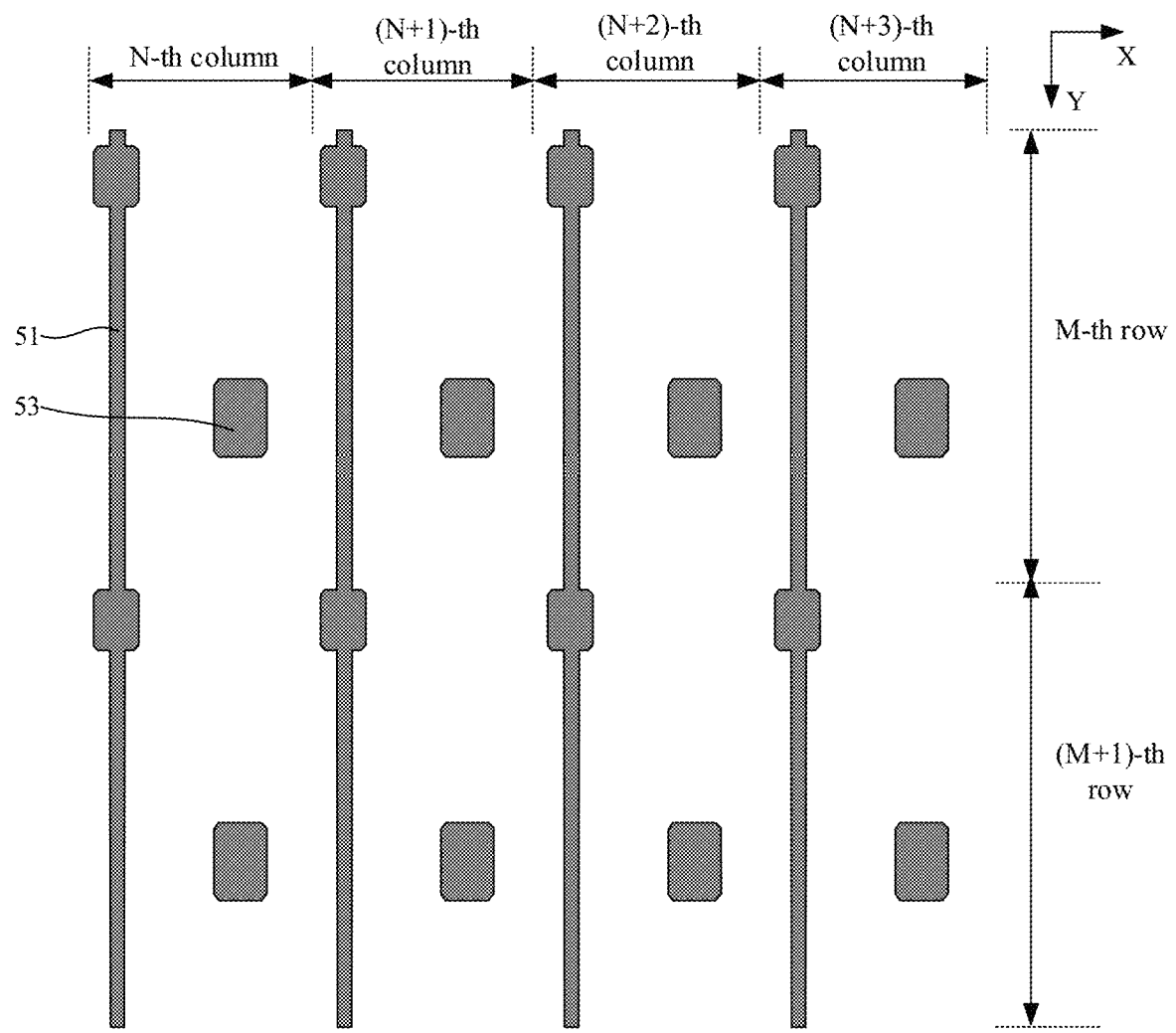

(7) A pattern of a fourth conductive layer is formed. In an exemplary embodiment, forming the pattern of the fourth conductive layer may include: a fourth conductive thin film is deposited on the base substrate on which the aforementioned patterns are formed, and the fourth conductive thin film is patterned through a patterning process to form the fourth conductive layer disposed on the first planarization layer, wherein a fourth conductive layer of each pixel at least includes a data signal line 51 and an anode connection electrode 53, as shown in FIG. 12a and FIG. 12b. FIG. 12b is a schematic plan view of the fourth conductive layer in FIG. 12a. In an exemplary embodiment, the fourth conductive layer may be called a second source drain metal (SD2) layer.

As shown in FIG. 6 to FIG. 12b, the data signal line 51 may extend along the second direction Y, and the data signal line 51 is connected with the data connection electrode 42 through the eleventh via V11. Since the data connection electrode 42 is connected with a first region of the fourth active layer through the fifth via V5, it is achieved that the data signal line 51 is connected with the first region of the fourth active layer through the data connection electrode 42, so that a data signal may be written into the fourth transistor T4. The data signal line 51 is disposed in the fourth conductive layer, which is beneficial to meet a requirement of a high refresh rate.

In an exemplary embodiment, the anode connection electrode 53 is connected with the third connection electrode 45 through the thirteenth via V13. Since the third connection electrode 45 is connected with a second region of the sixth active layer (also a second region of the seventh active layer) through the fourth via V4, it is achieved that the anode connection electrode 53 is connected with the second region of the sixth active layer (also the second region of the seventh active layer) through the third connection electrode 45. A shape of the anode connection electrode 53 may be a rectangle.

Figure 13A:
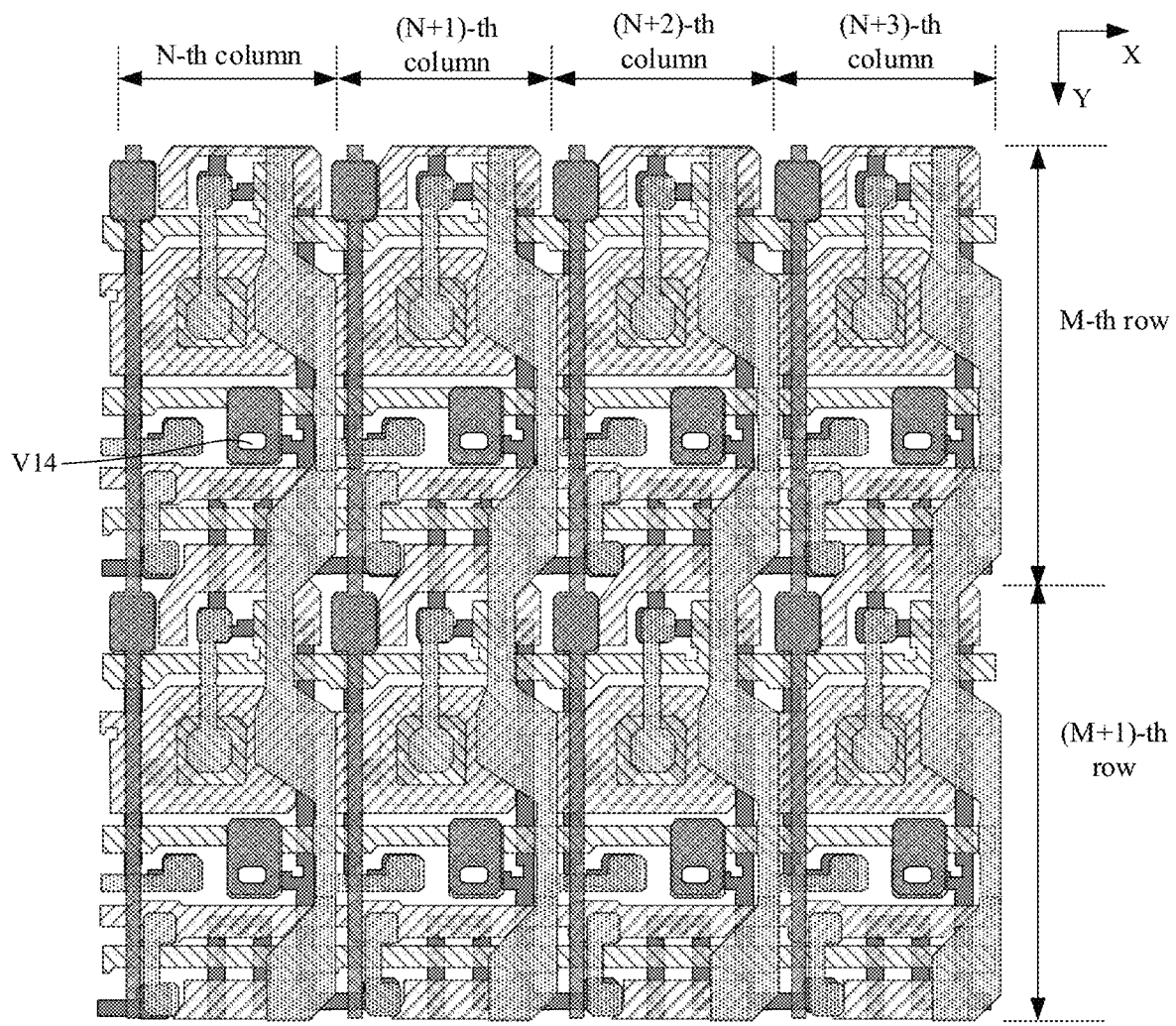
FIG. 13a is a schematic diagram of a display substrate after a pattern of a second planarization layer is formed according to some exemplary embodiments.
Figure 13B:
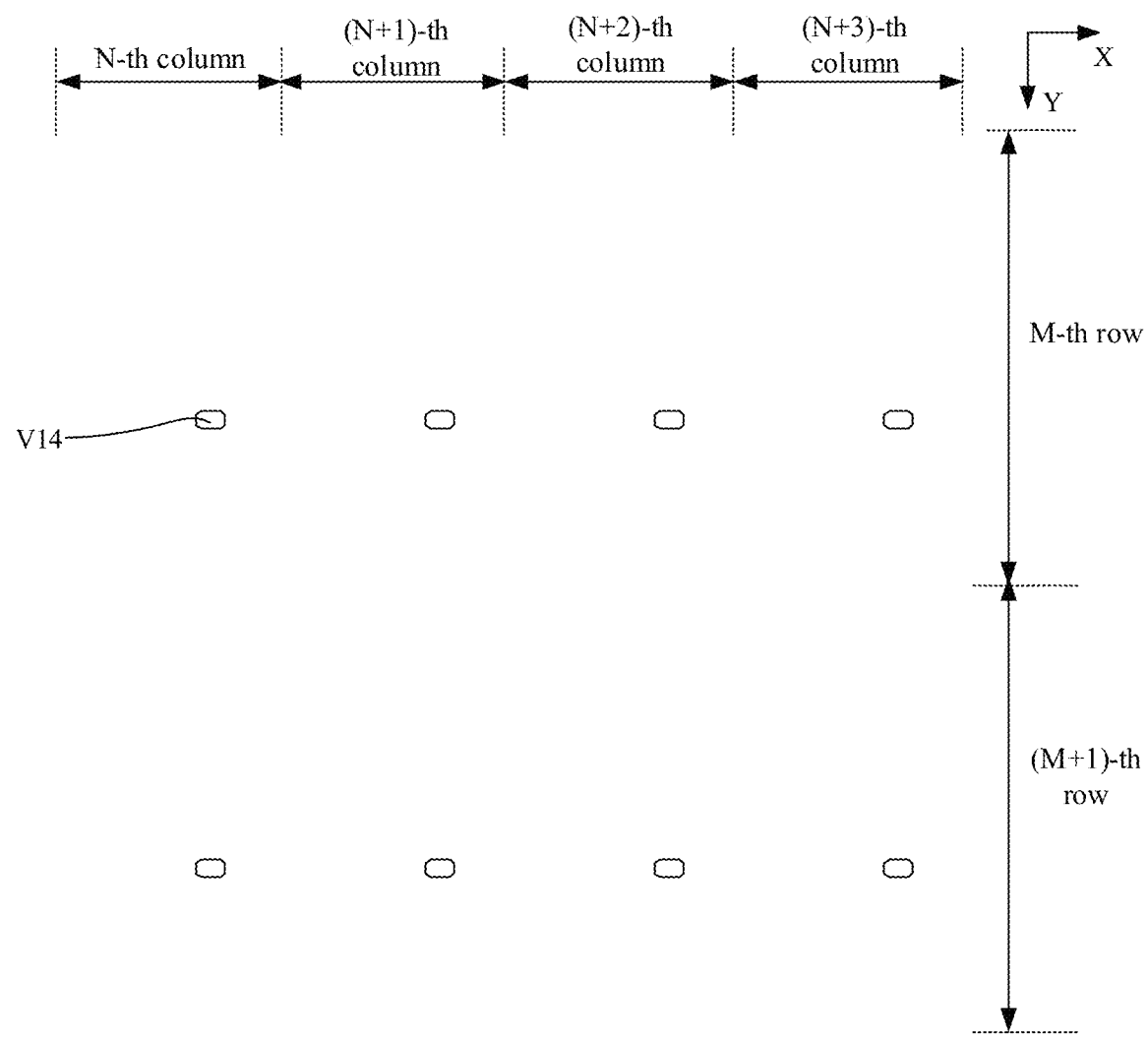

(8) A pattern of a second planarization layer is formed. In an exemplary embodiment, forming the pattern of the second planarization layer may include: a second planarization thin film is coated on the base substrate on which the aforementioned patterns are formed, and the second planarization thin film is patterned through a patterning process to form the second planarization layer covering the fourth conductive layer, wherein a second planarization layer of each pixel is provided with a fourteenth via V14, as shown in FIG. 13a and FIG. 13b. FIG. 13b is a schematic plan view of multiple vias of the second planarization layer in FIG. 13a.

As shown in FIG. 6 to FIG. 13b, the fourteenth via V14 is located in a region in which the anode connection electrode 53 is located, the second planarization layer in the fourteenth via V14 is removed to expose a surface of the anode connection electrode 53, and the fourteenth via V14 is configured such that an anode to be formed subsequently is connected with the anode connection electrode 53 through the via.

Figure 14A:
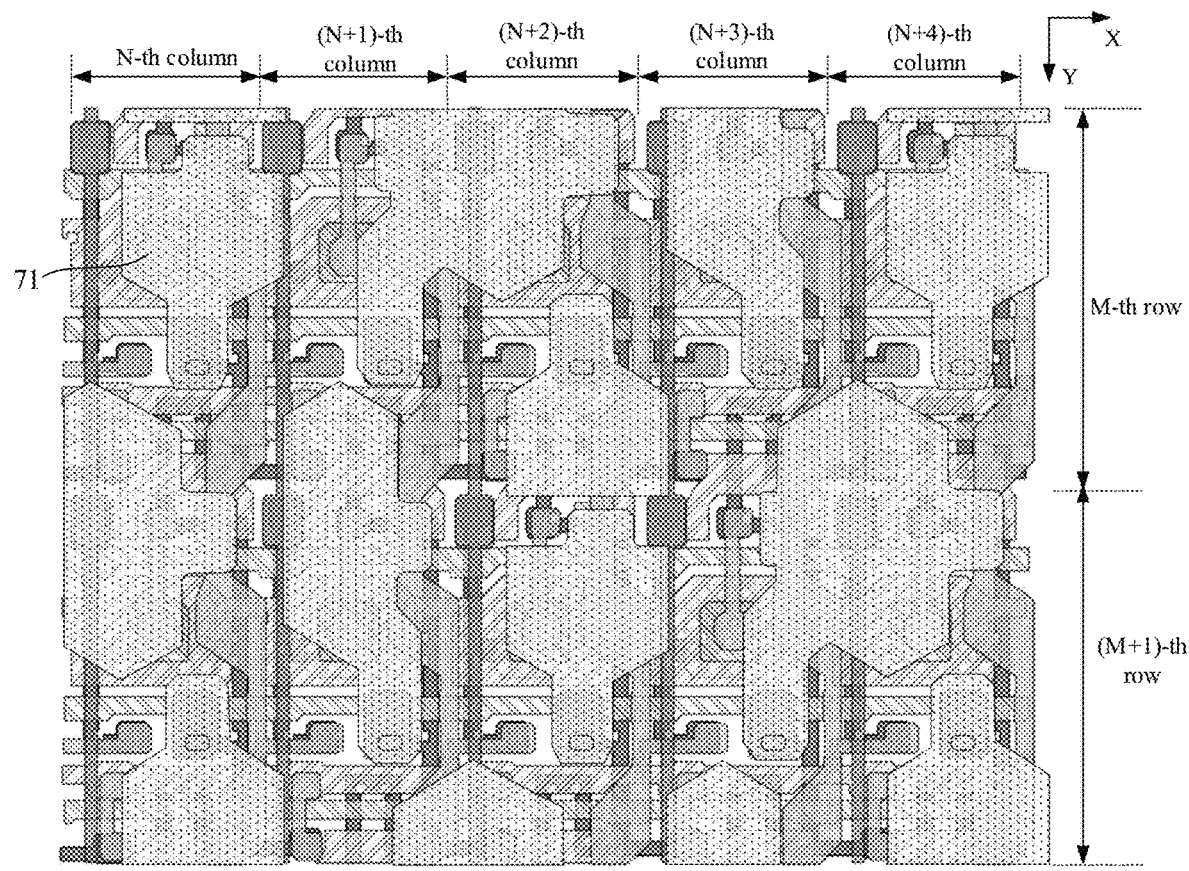
FIG. 14a is a schematic diagram of a display substrate after a pattern of an anode is formed according to some exemplary embodiments.
Figure 14B:
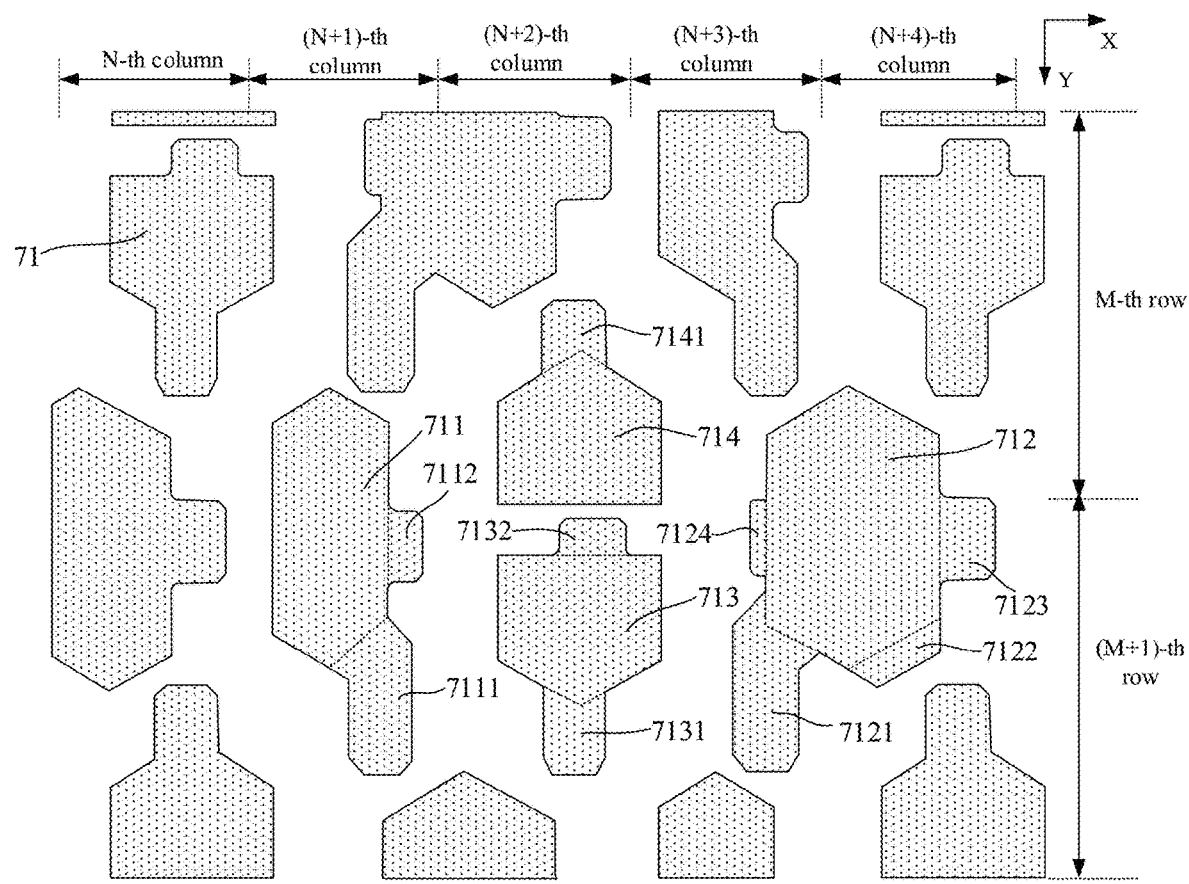

(9) A pattern of an anode is formed. In an exemplary embodiment, forming the pattern of the anode may include: a fifth conductive thin film is deposited on the base substrate on which the aforementioned patterns are formed, and the fifth conductive thin film is patterned through a patterning process to form an anode 71 disposed on the second planarization layer, as shown in FIG. 14a and FIG. 14b. FIG. 14b is a schematic plan view of the anode in FIG. 14a.

As shown in FIG. 6 to FIG. 14b, an anode 71 of each sub-pixel is connected with the anode connection electrode 53 through a fourteenth via V14 of the present sub-pixel. Since the anode connection electrode 53 is connected with the third connection electrode 45 through the thirteenth via V13, while the third connection electrode 45 is connected with the second region of the sixth active layer (also the second region of the seventh active layer) through the fourth via V4, and the third connection electrode 45 serves as a second electrode of the sixth transistor T6 and a second electrode of the seventh transistor T7, a connection between the anode 71 and, the sixth transistor T6 and the seventh transistor T7 through the anode connection electrode 53 and the third connection electrode 45 is achieved, so that it may be achieved that the pixel drive circuit drives a light emitting device to emit light.

In an exemplary embodiment, the display substrate may include multiple pixel units P arranged in an array, wherein each pixel unit P includes multiple sub-pixels, and each pixel unit P may include one first sub-pixel P1 that emits light of a first color, one second sub-pixel P2 that emits light of a second color, one third sub-pixel P3 that emits light of a third color, and one fourth sub-pixel P4 that emits light of a third color (both the third sub-pixel P3 and the fourth sub-pixel P4 emit light of the third color). Illustratively, the first sub-pixel P1 may emit red light, the second sub-pixel P2 may emit blue light, and the third sub-pixel P3 and the fourth sub-pixel P4 may emit green light.

In an exemplary embodiment, on the display substrate, a sub-pixel in an M-th row and an N-th column is a third sub-pixel P3, a sub-pixel in the M-th row and an (N+1)-th column is a second sub-pixel P2, a sub-pixel in the M-th row and an (N+2)-th column is a fourth sub-pixel P4, a sub-pixel in the M-th row and an (N+3)-th column is a first sub-pixel P1, a sub-pixel in the M-th row and an (N+4)-th column is a third sub-pixels P3; a sub-pixel in an (M+1)-th row and the N-th column is a fourth sub-pixel P4, a sub-pixel in the (M+1)-th row and the (N+1)-th column is a first sub-pixel P1, a sub-pixel in the (M+1)-th row and the (N+2)-th column is a third sub-pixel P3, a sub-pixel in the (M+1)-th row and the (N+3)-th column is a second sub-pixel P2, and a sub-pixel in the (M+1)-th row and the (N+4)-th column is a fourth sub-pixel P4. Herein, the sub-pixel in the M-th row and the (N+1)-th column (the second sub-pixel P2), the sub-pixel in the (M+1)-th row and the (N+1)-th column (the first sub-pixel P1), the sub-pixel in the M-th row and the (N+2)-th column (the fourth sub-pixel P4), and the sub-pixel in the (M+1)-th row and the (N+2)-th column (the third sub-pixel P3) may constitute one pixel unit. The first sub-pixel P1 may emit red light, the second sub-pixel P2 may emit blue light, and the third sub-pixel P3 and the fourth sub-pixel P4 may both emit green light. On the display substrate, shapes and areas of anodes of all first sub-pixels P1 may be same, shapes and areas of anodes of all second sub-pixels P2 may be same, shapes and areas of anodes of all third sub-pixels P3 may be same, and shapes and areas of anodes of all fourth sub-pixels P4 may be same. Shapes and areas of anodes of the first sub-pixel P1, the second sub-pixel P2, the third sub-pixel P3, and the fourth sub-pixel P4 may be different from each other.

In an exemplary embodiment, an anode of the first sub-pixel P1 may include a first region 711, and a first protruding part 7111 and a second protruding part 7112 connected with the first region 711. An orthographic projection of the first region 711 on the base substrate may be overlapped with an orthographic projection of a third active layer 13 of the present sub-pixel on the base substrate, the orthographic projection of the first region 711 on the base substrate may also be overlapped with an orthographic projection of a second active layer 12 of the present sub-pixel on the base substrate, and the orthographic projection of the first region 711 on the base substrate may also be overlapped with an orthographic projection of a fourth active layer 14 of the present sub-pixel on the base substrate. A shape of the first region 711 may be the same as a shape of a pixel opening of a pixel definition layer of the present sub-pixel subsequently formed (for example, all of them are hexagonal, and a "same shape" herein may have a difference in shape within a process error range), and an area of the first region 711 is larger than an area of the pixel opening of the present sub-pixel. The shape of the first region 711 may be a hexagon, a rectangle, or the like, and is a hexagon illustratively in the figure. The first protruding part 7111 is connected with the anode connection electrode 53 through a fourteenth via V14 of the present sub-pixel. An orthographic projection of the second protruding part 7112 on the base substrate may be overlapped with an orthographic projection of a second active layer 12 of the present sub-pixel on the base substrate. The first protruding part 7111 may include a first extending section and a second extending section sequentially connected, wherein a first terminal of the first extending section is connected with the first region 711, a second terminal of the first extending section is connected with a first terminal of the second extending section, and a second terminal of the second extending section extends along the second direction Y. The second terminal of the first extending section has offsets in both the first direction X and the second direction Y with respect to the first terminal of the first extending section and the second terminal of the second extending section is connected with the anode connection electrode 53 through the fourteenth via V14. The second protruding part 7112 may have a rectangular shape and may protrude along the first direction X.

In an exemplary embodiment, a second sub-pixel P2 adjacent to a fourth sub-pixel P4 is used as a compensation sub-pixel (in another implementation mode, a first sub-pixel P1 may be used as a compensation sub-pixel), and the conductive block is an anode of a light emitting device in the second sub-pixel P2. There is a third overlapping region between an orthographic projection of the anode of the second sub-pixel P2 on the base substrate and an orthographic projection of a gate electrode of the third transistor T3 of the adjacent fourth sub-pixel P4 on the base substrate. An area of the third overlapping region may be smaller than the area of the first overlapping region. In this way, it is beneficial to reduce a difference in parasitic capacitances of N2 nodes of the third sub-pixel and the fourth sub-pixel, thereby reducing a difference in currents of the third sub-pixel and the fourth sub-pixel, improving consistency of electrical environments of the third sub-pixel and the fourth sub-pixel, and improving consistency of light emitting brightness of the third sub-pixel and the fourth sub-pixel. The anode of the second sub-pixel P2 may include a second region 712, and a third protruding part 7121, a fourth protruding parts 7122, a fifth protruding parts 7123, and a sixth protruding part 7124 that are connected with the second region 712. A shape of the second region 712 may be the same as the shape of the pixel opening of the pixel definition layer of the present sub-pixel subsequently formed, and an area of the second region 712 is larger than the area of the pixel opening of the present sub-pixel. A shape of the second region 712 may be a hexagon, a rectangle, or the like, and is a hexagon illustratively in the figure. An orthographic projection of the second region 712 on the base substrate may be overlapped with the orthographic projection of the second active layer 12 of the present sub-pixel on the base substrate, and may be overlapped with orthographic projections of a fourth active layer 14 and the gate electrode of the third transistor T3 of the adjacent fourth sub-pixel P4 on the base substrate. The third protruding part 7121 may be connected with the anode connection electrode 53 through the fourteenth via V14 of the present sub-pixel. The third protruding part 7121 may include a third extending section and a fourth extending section sequentially connected, a first terminal of the third extending section is connected with the second region 712, a second terminal of the third extending section is connected with a first terminal of the fourth extending section, a second terminal of the fourth extending section extends along the second direction Y, the second terminal of the third extending section has offsets in an opposite direction of the first direction X and in the second direction Y with respect to the first terminal of the third extending section, and the second terminal of the fourth extending section is connected with the anode connection electrode 53 through the fourteenth via V14. An orthographic projection of the third protruding part 7121 on the base substrate may be overlapped with an orthographic projection of a third active layer 13 of the present sub-pixel on the base substrate. An orthographic projection of the fourth protruding part 7122 on the base substrate may be overlapped with an orthographic projection of a gate electrode of a third transistor T3 of an adjacent fourth sub-pixel P4 in a same row on the base substrate to form a fourth overlapping region, and the third overlapping region includes the fourth overlapping region. A shape of the fourth protruding part 7122 may be a trapezoid, two hypotenuse sides (two waists of the trapezoid) of the fourth protruding part 7122 are collinear with two sides of the second region 712 respectively, one side of the second region 712 serves as one common side of the second region 712 and the fourth protruding part 7122, a length of one side of the fourth protruding part 7122 away from the second region 712 is smaller than a length of the common side and is disposed parallel to the common side (there may be a range of an included angle within a process error range, for example, there may be an included angle of −10 degrees to 10 degrees). The fifth protruding part 7123 may extend along the first direction X, a shape of the fifth protruding part 7123 may be a rectangle, and an orthographic projection of the fifth protruding part 7123 on the base substrate may be overlapped with an orthographic projection of a second active layer 12 of the adjacent fourth sub-pixel P4 in the same row on the base substrate. The sixth protruding part 7124 may extend along the opposite direction of the first direction X, a shape of the sixth protruding part 7124 may be a rectangle, and an orthographic projection of the sixth protruding part 7124 on the base substrate may be overlapped with an orthographic projection of a second active layer 12 of the present sub-pixel on the base substrate. The fifth protruding part 7123 and the sixth protruding part 7124 are respectively located on opposite sides of the second region 712.

In an exemplary embodiment, there is a first overlapping region between an orthographic projection of an anode of the third sub-pixel P3 on the base substrate and an orthographic projection of a gate electrode of a third transistor T3 of the present sub-pixel on the base substrate. The anode of the third sub-pixel P3 may include a third region 713, and a seventh protruding part 7131 and an eighth protruding part 7132 connected with the third region 713. A shape of the third region 713 may be the same as a shape of a pixel opening of a pixel definition layer of the present sub-pixel subsequently formed, and an area of the third region 713 is larger than an area of the pixel opening of the present sub-pixel. The shape of the third region 713 may be a pentagon, a rectangle, or the like, which is a pentagon illustratively in the figure. An orthographic projection of the third region 713 on the base substrate may be overlapped with the orthographic projection of the gate electrode of the third transistor T3 of the present sub-pixel on the base substrate to form the first overlapping region, and the orthographic projection of the third region 713 on the base substrate may also be overlapped with an orthographic projection of a second active layer 12 of the present sub-pixel on the base substrate. The seventh protruding part 7131 may extend along the second direction Y, a first terminal of the seventh protruding part 7131 is connected with the third region 713, and a second terminal of the seventh protruding part 7131 is connected with the anode connection electrode 53 through a fourteenth via V14 of the present sub-pixel.

The eighth protruding part 7132 may extend along an opposite direction of the second direction Y, a shape of the eighth protruding part 7132 may be a rectangle, and an orthographic projection of the eighth protruding part 7132 on the base substrate may also be overlapped with the orthographic projection of the second active layer 12 of the present sub-pixel on the base substrate. The seventh protruding part 7131 and the eighth protruding part 7132 may be located on opposite sides of the third region 713 respectively.

In an exemplary embodiment, there is no overlapping region or there is a second overlapping region between an orthographic projection of an anode of the fourth sub-pixel P4 on the base substrate and the orthographic projection of the gate electrode of the third transistor T3 of the present sub-pixel on the base substrate, wherein an area of the second overlapping region is smaller than an area of the first overlapping region. The anode of the fourth sub-pixel P4 may include a fourth region 714, and a ninth protruding part 7141 connected with the fourth region 714. A shape of the fourth region 714 may be the same as the shape of the pixel opening of the pixel definition layer of the present sub-pixel subsequently formed, and an area of the fourth region 714 is larger than the area of the pixel opening of the present sub-pixel. The shape of the fourth region 714 may be a pentagon, a rectangle, or the like, which is a pentagon illustratively in the figure. An orthographic projection of the fourth region 714 on the base substrate may not be overlapped with the orthographic projection of the gate electrode of the third transistor T3 of the present sub-pixel on the base substrate. The ninth protruding part 7141 may be disposed on one side of the fourth region 714 facing the gate electrode of the third transistor of the present sub-pixel, and may extend along the opposite direction of the second direction Y. An orthographic projection of the ninth protruding part 7141 on the base substrate may not be overlapped with or may be partially overlapped with the orthographic projection of the gate electrode of the third transistor T3 of the present sub-pixel on the base substrate (forming the second overlapping region). The ninth protruding part 7141 may be connected with the anode connection electrode 53 through the fourteenth via V14 of the present sub-pixel. The ninth protruding part 7141 may include a first side away from the fourth region 714, and a second side connected with the fourth region 714 and adjacent to the first side, wherein a chamfer may be disposed at a connection of the first side and the second side; and one side of the fourth protruding part 7122 away from the second region 712 is disposed toward the chamfer and may be parallel to the chamfer. The ninth protruding part 7141 may also include a third side parallel to the second side and adjacent to the first side, terminals of the second side and the third side away from the first side are connected with intermediate positions (non-end positions) of two adjacent sides of the fourth region 714, respectively.

In an exemplary embodiment, there is no overlapping region or there is a second overlapping region between the orthographic projection of the anode of the light emitting device in the fourth sub-pixel P4 on the base substrate and the orthographic projection of the gate electrode of the third transistor T3 of the present sub-pixel on the base substrate, the area of the second overlapping region is smaller than an area of a first overlapping region of a third sub-pixel P3. This causes a parasitic capacitance of an N2 node in a pixel drive circuit of the third sub-pixel P3 to be larger than a parasitic capacitance of an N2 node in a pixel drive circuit of the fourth sub-pixel P4. If a difference in parasitic capacitances of N2 nodes in pixel drive circuits of the third sub-pixel P3 and the fourth sub-pixel P4 is relatively large, when a signal is written, it will be a relatively large difference in potentials written by the N2 nodes in the pixel drive circuits of the third sub-pixel P3 and the fourth sub-pixel P4, thereby causing a relatively large difference in currents of the third sub-pixel P3 and the fourth sub-pixel P4 when they emit light (that is, a current of the third sub-pixel P3 will be much smaller than a current of the fourth sub-pixel P4), and further causing brightness of the third sub-pixel P3 and the fourth sub-pixel P4 be inconsistent, affecting a display effect. In an exemplary embodiment, a second sub-pixel P2 adjacent to a fourth sub-pixel P4 is used as a compensation sub-pixel, there is a third overlapping region between an orthographic projection of an anode of a light emitting device in the second sub-pixel P2 on the base substrate and an orthographic projection of a gate electrode of a third transistor T3 of the adjacent fourth sub-pixel P4 on the base substrate. Thus, through the third overlapping region existing between the orthographic projections of the anode of the light emitting device in the second sub-pixel P2 and the gate electrode of the third transistor T3 of the adjacent fourth sub-pixel P4 on the base substrate (i.e., increasing an overlapping area of the gate electrode of the third transistor T3 of the fourth sub-pixel P4 and the anode), a parasitic capacitance of an N2 node of the adjacent fourth sub-pixel P4 is compensated, thereby reducing a difference in parasitic capacitances of N2 nodes of the fourth sub-pixel and the third sub-pixel, and then decreasing a difference in brightness of the fourth sub-pixel and the third sub-pixel, improving a display effect. In an exemplary embodiment, a second sub-pixel P2 adjacent to a fourth sub-pixel P4 is used as a compensation sub-pixel, and an anode of a light emitting device in the second sub-pixel P2 includes a fourth protruding part 7122, wherein an orthographic projection of the fourth protruding part 7122 on the base substrate may be overlapped with an orthographic projection of a gate electrode of a third transistor T3 of the adjacent fourth sub-pixel P4 in a same row on the base substrate to form a fourth overlapping region, and the third overlapping region includes the fourth overlapping region. A shape of the fourth protruding part 7122 is set to be a trapezoid, and one side of the fourth protruding part 7122 away from the second region 712 is disposed towards one chamfer of the ninth protruding part 7141 of the anode of the fourth sub-pixel P4 and parallel to the chamfer. Thus, an area of the fourth protruding part 7122 facing the ninth protruding part 7141 may be increased, which is beneficial to increase a parasitic capacitance formed between the fourth protruding part 7122 and the ninth protruding part 7141, so that a potential of the fourth protruding part 7122 is influenced to some extent by a potential of the anode of the fourth sub-pixel P4, and a parasitic capacitance generated between the anode of the light emitting device in the second sub-pixel P2 and the gate electrode of the third transistor T3 of the adjacent fourth sub-pixel P4 is more like a parasitic capacitance generated by overlapping the anode of the light emitting device in the fourth sub-pixel P4 with the gate electrode of the third transistor T3 of the fourth sub-pixel P4. Furthermore, it is beneficial to make a difference between the parasitic capacitance of the N2 node of the fourth sub-pixel P4 and the parasitic capacitance of the N2 node of the third sub-pixel smaller, improving a display effect.

In another implementation mode, it may be designed according to a pixel structure that the anode of the light emitting device in the fourth sub-pixel P4 or an anode of a light emitting device in a first sub-pixel P1 is used for compensating the parasitic capacitance of the N2 node of the fourth sub-pixel P4, for example, an overlapping area of orthographic projections of the anode of the light emitting device in the fourth sub-pixel P4 and the gate electrode of the third transistor T3 of the present sub-pixel on the base substrate may be increased to increase the parasitic capacitance of the N2 node of the fourth sub-pixel P4.

After testing, in a case that the parasitic capacitance of the N2 node of the fourth sub-pixel P4 is not compensated, a parasitic capacitance of an N2 node of a third sub-pixel P3 is 55.45 fF (flying farad), the parasitic capacitance of the N2 node of the fourth sub-pixel P4 is 54.66 fF, and a difference between currents of the third sub-pixel P3 and the fourth sub-pixel P4 when emitting light is 16.30%. In a case in which the parasitic capacitance of the N2 node of the fourth sub-pixel P4 is compensated by using a solution of the exemplary embodiment of the present disclosure, the parasitic capacitance of the N2 node of the third sub-pixel P3 is 55.45 fF, the parasitic capacitance of the N2 node of the fourth sub-pixel P4 is 55.41 fF, and a difference between currents of the third sub-pixel P3 and the fourth sub-pixel P4 when emitting light is 6.9%. It may be seen from this that after compensating the parasitic capacitance of the N2 node of the fourth sub-pixel P4 by using the solution of the exemplary embodiment of the present disclosure, the parasitic capacitance of the N2 node of the fourth sub-pixel P4 is increased, and a difference in parasitic capacitances of N2 nodes of the fourth sub-pixel and the third sub-pixel is reduced, thereby reducing a difference in brightness between the fourth sub-pixel and the third sub-pixel.

Figure 15A:
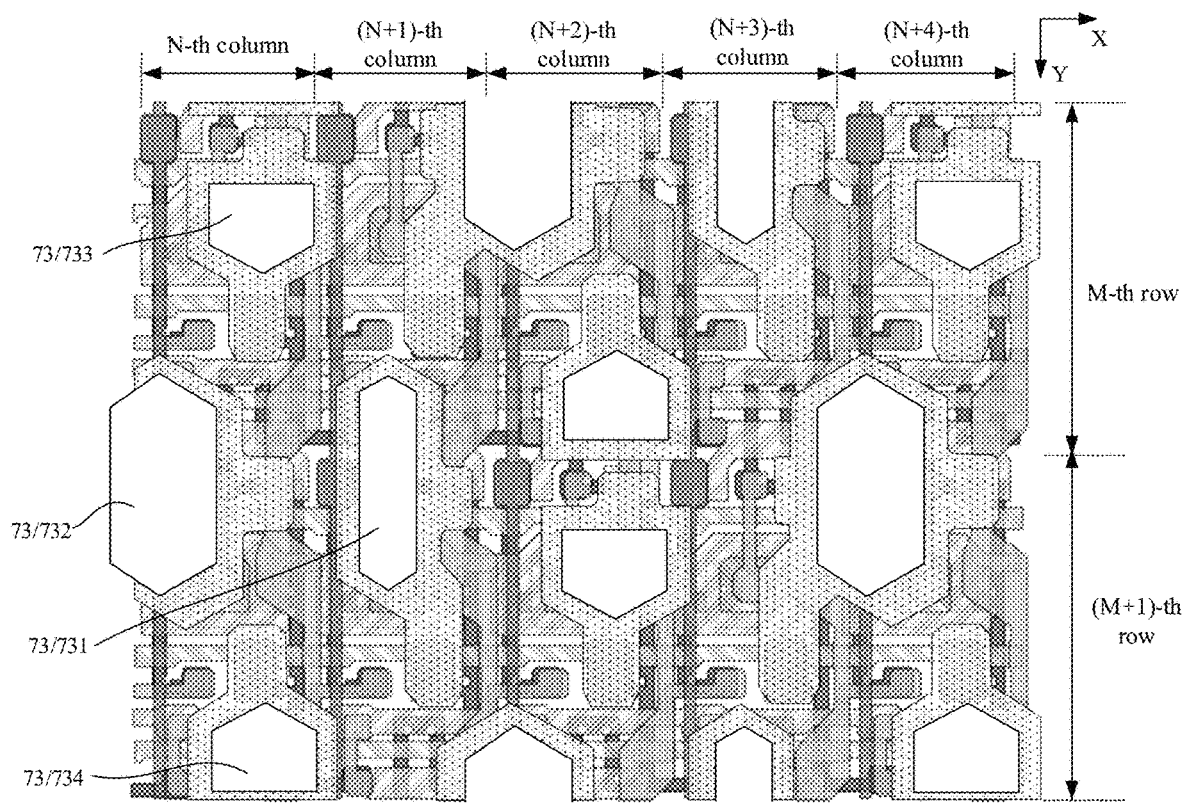
FIG. 15a is a schematic diagram of a display substrate after a pattern of a pixel definition layer is formed according to some exemplary embodiments.
Figure 15B:
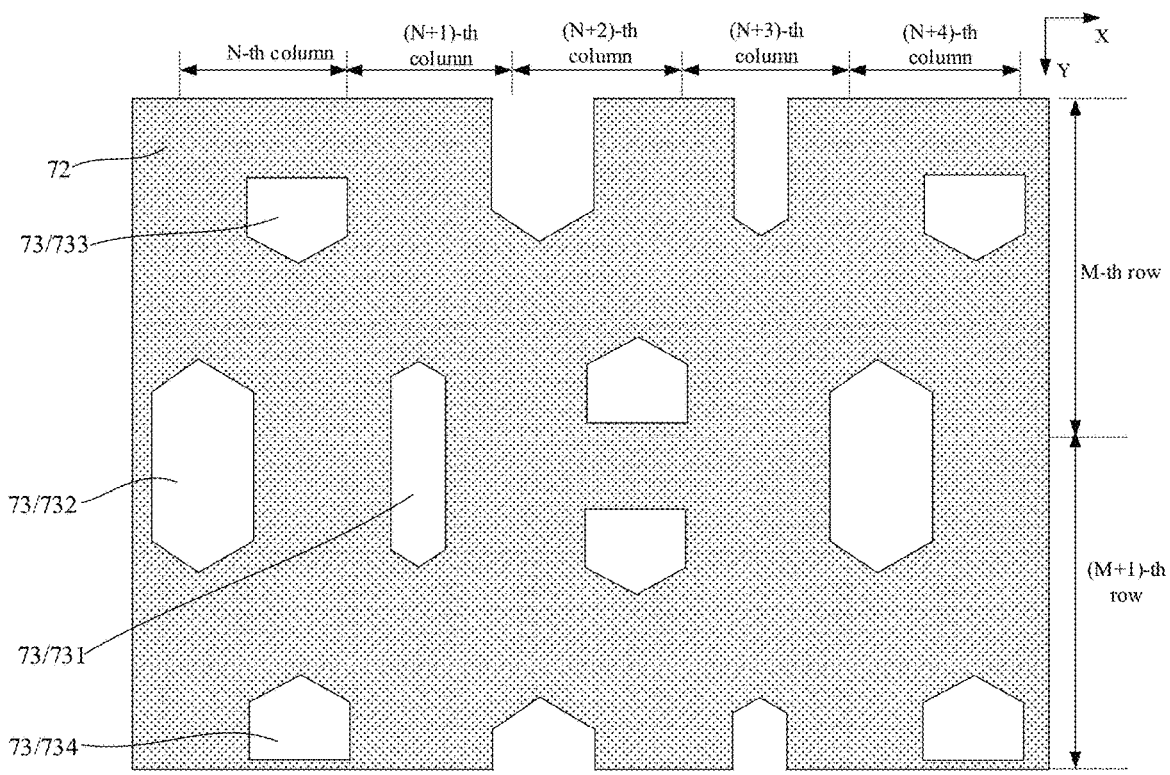

(10) A pattern of a pixel definition layer is formed. In an exemplary embodiment, forming the pattern of the pixel definition layer may include: a pixel definition thin film is coated on the base substrate on which the aforementioned patterns are formed, and the pixel definition thin film is patterned through a patterning process to form a pixel definition layer 72, wherein a pixel definition layer 72 of each sub-pixel is disposed with a pixel opening 73, and the pixel opening 73 exposes an anode and covers a portion of the anode close to a circumferential edge, as shown in FIG. 15a and FIG. 15b. FIG. 15b is a schematic plan view of the pixel definition layer in FIG. 15a.

As shown in FIG. 6 to FIG. 15b, an orthographic projection of at least one pixel opening 73 on the base substrate may avoid an orthographic projection of a wiring of the fourth conductive layer on the base substrate; or, the orthographic projection of the at least one pixel opening 73 on the base substrate may be overlapped with the orthographic projection of the wiring of the fourth conductive layer on the base substrate, and the orthographic projection of the at least one pixel opening 73 on the base substrate may be bisected along the first direction X or the second direction Y by the orthographic projection of the wiring of the fourth conductive layer on the base substrate, so that a problem of color cast of a large viewing angle may be avoided. Illustratively, the wiring of the fourth conductive layer may include the data signal line 51 and the anode connection electrode 53. A pixel opening 731 of the first sub-pixel P1, a pixel opening 733 of the third sub-pixel P3, and a pixel opening 734 of the fourth sub-pixel P4 each avoid the data signal line 51 and the anode connection electrode 53, a pixel opening 732 of the second sub-pixel P2 avoids the anode connection electrode 53, and an orthographic projection of the pixel opening 732 of the second sub-pixel P2 on the base substrate is bisected along the second direction Y by an orthographic projection of the data signal line 51 on the base substrate.

In an exemplary embodiment, a shape of a pixel opening 73 of each sub-pixel may be adapted to a shape of a region of an anode of a present sub-pixel after removing a protruding part. For example, a shape of a first region 711 of an anode of the first sub-pixel P1 is a hexagon, and a shape of a pixel opening 731 of the first sub-pixel P1 is a hexagon; a shape of a second region 712 of an anode of the second sub-pixel P2 is a hexagon, and a shape of a pixel opening 732 of the second sub-pixel P2 is a hexagon; a shape of a third region 713 of an anode of the third sub-pixel P3 is a pentagon, and a shape of a pixel opening 733 of the third sub-pixel P3 is a pentagon; a shape of a fourth region 714 of an anode of the fourth sub-pixel P4 is a pentagon, and a shape of a pixel opening 734 of the fourth sub-pixel P4 is a pentagon. In another implementation mode, a shape of a pixel opening may all be a rectangle.

In an exemplary embodiment, a subsequent preparation flow may include: an organic emitting layer is formed using an evaporation process or an ink-jet printing process, the organic emitting layer is connected with an anode through a pixel opening, and a cathode is formed on the organic emitting layer, the cathode is connected with the organic emitting layer. An encapsulation layer is formed. The encapsulation layer may include a first encapsulation layer, a second encapsulation layer, and a third encapsulation layer that are stacked. The first encapsulation layer and the third encapsulation layer may be made of an inorganic material. The second encapsulation layer may be made of an organic material. The second encapsulation layer is arranged between the first encapsulation layer and the third encapsulation layer so that it may be ensured that external water vapor cannot enter the light emitting structure layer.

In an exemplary implementation mode, the base substrate may be a flexible base substrate or a rigid base substrate. The rigid base substrate may be made of, but is not limited to, one or more of glass and quartz. The flexible base substrate may be made of, but is not limited to, one or more of polyethylene terephthalate, ethylene terephthalate, polyether ether ketone, polystyrene, polycarbonate, polyarylate, polyarylester, polyimide, polyvinyl chloride, polyethylene, and textile fibers. In an exemplary implementation mode, the flexible substrate may include a first flexible material layer, a first inorganic material layer, an adhesion layer, a second flexible material layer, and a second inorganic material layer which are stacked, wherein materials of the first flexible material layer and the second flexible material layer may be Polyimide (PI), Polyethylene Terephthalate (PET), or a surface-treated polymer soft film etc., materials of the first inorganic material layer and the second inorganic material layer may be Silicon Nitride (SiNx) or Silicon Oxide (SiOx), etc., for improving water-resistance and oxygen-resistance of the base substrate, and a material of the adhesion layer may be amorphous silicon (a-si).

In an exemplary embodiment, the first conductive layer, the second conductive layer, the third conductive layer, and the fourth conductive layer may all be made of metal materials, such as any one or more of silver (Ag), copper (Cu), aluminum (Al), and molybdenum (Mo), or an alloy material of the above metals, such as an aluminum neodymium alloy (AlNd) or a molybdenum niobium alloy (MoNb), and may be in a single-layer structure or a multi-layer composite structure, such as Mo/Cu/Mo. The first insulation layer 51, the second insulation layer 52, the third insulation layer 53, and the fourth insulation layer 54 may all be made of any one or more of Silicon Oxide (SiOx), Silicon Nitride (SiNx), and Silicon Oxynitride (SiON), and may be in a single-layer structure or a multi-layer composite structure. The first insulation layer may be referred to as a buffer layer and used for improving a water and oxygen resistance capability of the base substrate. The second insulation layer and the third insulation layer may be referred to as Gate Insulators (GIs). The fourth insulation layer may be referred to as an Interlayer Dielectric (ILD) layer. The active layer may be made of materials such as amorphous Indium Gallium Zinc Oxide (a-IGZO), Zinc Oxynitride (ZnON), Indium Zinc Tin Oxide (IZTO), amorphous Silicon (a-Si), polysilicon (p-Si), hexathiophene, or polythiophene. That is, the present disclosure is applicable to transistors that are manufactured based on an oxide technology, a silicon technology, or an organic matter technology. The first planarization layer and the second planarization layer may be made of an organic material, such as a resin. The anode may use a single-layer structure, such as Indium Tin Oxide (ITO) or Indium Zinc Oxide (IZO); or, the anode may use a multi-layer composite structure, such as ITO/Ag/ITO. The pixel definition layer may be made of polyimide, acrylic, or polyethylene terephthalate. The cathode may be made of any one or more of magnesium (Mg), silver (Ag), aluminum (Al), copper (Cu), and lithium (Li), or an alloy made of any one or more of the above metals.

An embodiment of the present disclosure further provides a display apparatus, which includes the aforementioned display substrate. The display apparatus may be any product or component with a display function, such as a mobile phone, a tablet computer, a television, a display, a laptop computer, a digital photo frame, and a navigator, and the embodiment of the present disclosure is not limited thereto.

The invention claimed is:

1. A display substrate comprises: multiple sub-pixels arranged in an array, wherein the multiple sub-pixels comprise a first sub-pixel emitting light of a first color, a second sub-pixel emitting light of a second color, and a third sub-pixel and a fourth sub-pixel emitting light of a third color;
  at least one sub-pixel comprises a drive circuit layer disposed on a base substrate and a light emitting structure layer disposed on one side of the drive circuit layer away from the base substrate, the drive circuit layer comprises a pixel drive circuit, the pixel drive circuit comprises a drive transistor and a storage capacitor, and the light emitting structure layer comprises a light emitting device connected with the pixel drive circuit;
  there is a first overlapping region between an orthographic projection of an anode of a light emitting device in the third sub-pixel on the base substrate and an orthographic projection of a gate electrode of a drive transistor in the third sub-pixel on the base substrate;
  there is no overlapping region between an orthographic projection of an anode of a light emitting device in the fourth sub-pixel on the base substrate and an orthographic projection of a gate electrode of a drive transistor in the fourth sub-pixel on the base substrate; or, there is a second overlapping region between an orthographic projection of an anode of a light emitting device in the fourth sub-pixel on the base substrate and an orthographic projection of a gate electrode of a drive transistor in the fourth sub-pixel on the base substrate, wherein an area of the second overlapping region is smaller than an area of the first overlapping region;
  the fourth sub-pixel, or the first sub-pixel or the second sub-pixel adjacent to the fourth sub-pixel, comprises a conductive block, wherein there is a third overlapping region between an orthographic projection of the conductive block on the base substrate and the orthographic projection of the gate electrode of the drive transistor in the fourth sub-pixel on the base substrate;
  wherein the conductive block is an anode of a light emitting device in a sub-pixel in which the conductive block is located;
  or, a pixel drive circuit of a sub-pixel in which the conductive block is located comprises the conductive block;
  wherein the first sub-pixel or the second sub-pixel adjacent to the fourth sub-pixel serves as a compensation sub-pixel, and the conductive block is an anode of a light emitting device in the compensation sub-pixel.

2. The display substrate according to claim 1, wherein a potential of the conductive block is different from a potential of the anode of the light emitting device in the fourth sub-pixel.

3. The display substrate according to claim 1, wherein an area of the third overlapping region is smaller than the area of the first overlapping region.

4. The display substrate according to claim 1, wherein the light emitting structure layer further comprises a pixel definition layer, the pixel definition layer is provided with a pixel opening exposing an anode of the light emitting device;
  one conductive layer in the drive circuit layer away from the base substrate comprises a data signal line;
  an orthographic projection of at least one of pixel openings on the base substrate avoids an orthographic projection of a wiring of a conductive layer provided with the data signal line on the base substrate, or an orthographic projection of at least one of pixel openings on the base substrate is bisected by an orthographic projection of a wiring of a conductive layer provided with the data signal line on the base substrate.

5. The display substrate according to claim 4, wherein the drive circuit layer comprises a semiconductor layer, a first conductive layer, a second conductive layer, a third conductive layer, and a fourth conductive layer that are sequentially stacked on the base substrate;
  the semiconductor layer comprises an active layer of the drive transistor, the first conductive layer comprises a first electrode plate of the storage capacitor and a scan signal line, the second conductive layer comprises a second electrode plate of the storage capacitor, the third conductive layer comprises a power line, and the fourth conductive layer comprises a data signal line;
  the scan signal line extends along a first direction, and both the power line and the data signal line extend along a second direction, wherein the second direction intersects the first direction.

6. The display substrate according to claim 1, wherein the pixel drive circuit further comprises a writing transistor, wherein a gate electrode of the writing transistor is connected with a scan signal line, a first electrode of the writing transistor is connected with a data signal line, and a second electrode of the writing transistor is connected with a first electrode of the drive transistor;
  an orthographic projection of the anode of the light emitting device in the compensation sub-pixel on the base substrate is also overlapped with an orthographic projection of an active layer of a writing transistor in the adjacent fourth sub-pixel on the base substrate.

7. The display substrate according to claim 1, wherein the pixel drive circuit further comprises a compensation transistor, wherein a gate electrode of the compensation transistor is connected with a scan signal line, a first electrode of the compensation transistor is connected with a gate electrode of the drive transistor, and a second electrode of the compensation transistor is connected with a second electrode of the drive transistor;

an orthographic projection of the anode of the light emitting device in the compensation sub-pixel on the base substrate is also overlapped with an orthographic projection of an active layer of a compensation transistor in the adjacent fourth sub-pixel on the base substrate.

8. The display substrate according to claim 7, wherein the orthographic projection of the anode of the light emitting device in the compensation sub-pixel on the base substrate is also overlapped with an orthographic projection of an active layer of a compensation transistor in the compensation sub-pixel on the base substrate.

9. The display substrate according to claim 1, wherein an orthographic projection of the anode of the light emitting device in the compensation sub-pixel on the base substrate is also overlapped with an orthographic projection of an active layer of a drive transistor in the compensation sub-pixel on the base substrate.

10. The display substrate according to claim 1, wherein the light emitting structure layer further comprises a pixel definition layer, and the pixel definition layer is provided with a pixel opening exposing an anode of the light emitting device;

an anode of a light emitting device in the compensation sub-pixel comprises a second region, and a third protruding part and a fourth protruding part connected with the second region;

a shape of the second region is the same as a shape of the pixel opening in the compensation sub-pixel, and an area of the second region is larger than an area of the pixel opening in the compensation sub-pixel;

the third protruding part is connected with a pixel drive circuit of the compensation sub-pixel through a via;

there is a fourth overlapping region between an orthographic projection of the fourth protruding part on the base substrate and an orthographic projection of a gate electrode of a drive transistor in the adjacent fourth sub-pixel on the base substrate, and the third overlapping region comprises the fourth overlapping region.

11. The display substrate according to claim 10, wherein the shape of the second region is a hexagon, and a shape of the fourth protruding part is a trapezoid, and two hypotenuse sides of the fourth protruding part are collinear with two sides of the second region respectively.

12. The display substrate according to claim 11, wherein the anode of the light emitting device in the fourth sub-pixel comprises a fourth region and a ninth protruding part connected with the fourth region;

the ninth protruding part is disposed on one side of the fourth region facing the gate electrode of the drive transistor in the fourth sub-pixel, and is connected with a pixel drive circuit of the fourth sub-pixel through a via.

13. The display substrate according to claim 12, wherein the ninth protruding part comprises a first side away from the fourth region, and a second side connected with the fourth region and adjacent to the first side, and a chamfer is provided at a connection of the first side and the second side; one side of the fourth protruding part away from the second region is disposed toward the chamfer and is parallel to the chamfer.

14. The display substrate according to claim 10, wherein the pixel drive circuit further comprises a compensation transistor, a gate electrode of the compensation transistor is connected with a scan signal line, a first electrode of the compensation transistor is connected with a gate electrode of the drive transistor, and a second electrode of the compensation transistor is connected with a second electrode of the drive transistor;

the anode of the light emitting device in the compensation sub-pixel further comprises a fifth protruding part and a sixth protruding part connected with the second region, and the fifth protruding part and the sixth protruding part are located on opposite sides of the second region;

an orthographic projection of the fifth protruding part on the base substrate is overlapped with an orthographic projection of an active layer of a compensation transistor in the adjacent fourth sub-pixel on the base substrate, and an orthographic projection of the sixth protruding part on the base substrate is overlapped with an orthographic projection of an active layer of a compensation transistor in the compensation sub-pixel on the base substrate.

15. The display substrate according to claim 7, wherein the anode of the light emitting device in the third sub-pixel comprises a third region, and a seventh protruding part and an eighth protruding part connected with the third region;

a shape of the third region is the same as the shape of a pixel opening in the third sub-pixel, and an area of the third region is larger than an area of the pixel opening in the third sub-pixel;

the seventh protruding part and the eighth protruding part are located on opposite sides of the third region, the seventh protruding part is connected with a pixel drive circuit of the third sub-pixel through a via, and an orthographic projection of the eighth protruding part on the base substrate is overlapped with an orthographic projection of an active layer of a compensation transistor in the third sub-pixel on the base substrate.

16. The display substrate according to claim 1, wherein the multiple sub-pixels are arranged in multiple pixel rows and multiple pixel columns, multiple sub-pixels of a same pixel row are arranged along a first direction, and multiple sub-pixels of a same pixel column are arranged along a second direction, and the second direction intersects the first direction;

any one of fourth sub-pixels and a third sub-pixel adjacent to the fourth sub-pixel are located in a same pixel column, and any one of the fourth sub-pixels, and a first sub-pixel and a second sub-pixel adjacent to the fourth sub-pixel are located in a same pixel row.

17. The display substrate according to claim 16, wherein the first sub-pixel and the second sub-pixel are alternately disposed in a same pixel column, and the third sub-pixel and the fourth sub-pixel are alternately disposed in a same pixel column.

18. A display apparatus, comprising the display substrate according to claim 1.

* * * * *